United States Patent
Ohtake et al.

(10) Patent No.: US 7,482,694 B2
(45) Date of Patent: Jan. 27, 2009

(54) SEMICONDUCTOR DEVICE AND ITS MANUFACTURING METHOD

(75) Inventors: Hiroto Ohtake, Tokyo (JP); Munehiro Tada, Tokyo (JP); Yoshimichi Harada, Tokyo (JP); Ken'ichiro Hijioka, Tokyo (JP); Shinobu Saitoh, Tokyo (JP); Yoshihiro Hayashi, Tokyo (JP)

(73) Assignee: NEC Coporation, Tokyo (JP)

( * ) Notice: Subject to any disclaimer, the term of this patent is extended or adjusted under 35 U.S.C. 154(b) by 0 days.

(21) Appl. No.: 10/509,898

(22) PCT Filed: Mar. 31, 2003

(86) PCT No.: PCT/JP03/04063

§ 371 (c)(1),
(2), (4) Date: Oct. 1, 2004

(87) PCT Pub. No.: WO03/083935

PCT Pub. Date: Oct. 9, 2003

(65) Prior Publication Data

US 2005/0253272 A1    Nov. 17, 2005

(30) Foreign Application Priority Data

Apr. 3, 2002    (JP) .............................. 2002-101873

(51) Int. Cl.
*H01L 23/522* (2006.01)
(52) U.S. Cl. ............................. 257/774; 257/E23.145; 257/E21.577; 257/E21.578; 257/E21.579; 257/E21.585; 438/637; 438/638; 438/639; 438/640
(58) Field of Classification Search .................. None
See application file for complete search history.

(56) References Cited

U.S. PATENT DOCUMENTS 5,872,061 A * 2/1999 Lee et al. ..................... 438/705
6,114,250 A * 9/2000 Ellingboe et al. ........... 438/709

(Continued)

FOREIGN PATENT DOCUMENTS

JP    H07-193049 A    7/1995

(Continued)

OTHER PUBLICATIONS

H. Hanahata et al., "Dependency of Basic Properties of Porous Silica ILD Thin Films in the k Range 1.6-2.7 on CMP Compatibility", Conference Proceedings ULSI XVI, 2001, Materials Research Society, p. 629.

*Primary Examiner*—Andy Huynh
*Assistant Examiner*—Hoang-Quan T Ho
(74) *Attorney, Agent, or Firm*—Sughrue Mion, PLLC

(57) ABSTRACT

A technique is provided for protecting an interlayer insulating film formed of an organic low dielectric constant material from any damage applied in a semiconductor process, and for attaining the decrease leak current in the interlayer insulating film, resulting in the improvement of reliability of a semiconductor device. The semiconductor device according to the present invention has an organic insulating films having openings. The organic insulating films have modified portions facing the openings. The modified portions contains fluorine atoms and nitrogen atoms. The concentration of the fluorine atoms in the modified portions is lower than the concentration of the nitrogen atoms. The above-mentioned modified layers protect the semiconductor device from the damage applied in the semiconductor process, while suppressing the corrosion of the conductors embedded in the openings.

5 Claims, 30 Drawing Sheets

U.S. PATENT DOCUMENTS

2002/0061654 A1 * 5/2002 Kanegae et al. ............. 438/710

FOREIGN PATENT DOCUMENTS

| JP | H10-125783 | * | 5/1998 |
| --- | --- | --- | --- |
| JP | H10-125783 A | | 5/1998 |
| JP | 2000-036484 | * | 6/1998 |
| JP | H11-297829 | * | 10/1999 |
| JP | H11-297829 A | | 10/1999 |
| JP | 2000-36484 | * | 2/2000 |
| JP | 2000-36484 A | | 2/2000 |
| JP | 2000-114367 | * | 4/2000 |
| JP | 2000-114367 A | | 4/2000 |
| JP | 2000-269185 A | | 9/2000 |
| JP | 2001-35832 A | | 2/2001 |
| JP | 2001-351897 A | | 12/2001 |
| JP | 2001-351976 A | | 12/2001 |
| JP | 2002-110788 | * | 4/2002 |
| JP | 2002-110788 A | | 4/2002 |
| JP | 2003-92287 | * | 3/2003 |
| JP | 2003-92287 A | | 3/2003 |

* cited by examiner

Fig. 9

| SIGNAL INTENSITY(a.u.) | AFTER ETCHING | AFTER RINSE |
|---|---|---|
| CARBON (C) | 5151 | 5976 |
| FLUORINE (F) | 2189 | 461 |
| NITROGEN (N) | 626 | 573 |

SEMICONDUCTOR DEVICE AND ITS MANUFACTURING METHOD

TECHNICAL FIELD

The present invention relates to a semiconductor device and a manufacturing method for the same. The present invention especially relates to a semiconductor device, in which organic low dielectric constant material is used for an inter-layer insulating film, and a manufacturing method for the same.

BACKGROUND ART

In order to reduce a wiring delay in a semiconductor device, it is considered to use organic material having a low dielectric constant for an inter-layer insulating film. Hydrocarbon-based polymer such as divinyl-siloxane benzo cyclobutene (BCB) polymer, poly-phenylene, polyallyere ether, polyallylene, and organic silica such as methyl silica are the organic materials suitable for the inter-layer insulating film. In order to further reduce effective dielectric constant, it is considered to use organic silica with a porous structure for the interlayer insulating film. Such a technique is disclosed in, for example, "Dependency of Basic Properties of Porous Silica ILD Thin Films in the k Range 1.6-2.7 on CMP Compatibility", H. Hanahata et sl., (Conference Proceedings ULSI XVI, 2001, Materials Research Society, P. 629).

In order to use the organic low dielectric constant material for the inter-layer insulating film, it is necessary to process an organic film made of the organic low dielectric constant material. For this reason, the development of an organic film processing technique has been advanced.

A first conventional technique for the organic film processing intended to avoid shape abnormality such as undercut and bowing, and to process the organic low dielectric constant material film into a predetermined shape is disclosed in Japanese Laid Open Patent Application (JP-P2000-36484A). In the first conventional organic film processing technique, a mixed gas of hydrogen atoms containing gas and nitrogen atoms containing gas is used as an etching gas for the organic low dielectric constant material film. The usage of the mixed gas of the hydrogen atoms containing gas and the nitrogen atoms containing gas improves the anisotropy of etching, and avoids the shape abnormality such as the undercut and the bowing. The first conventional technique further discloses that when poly-organo-siloxane bridge bis-benzo-cyclobutene is used as the organic low dielectric constant material, oxygen gas and difluoro methylene are added to the above-mentioned mixed gas.

Moreover, a second conventional technique for the organic film processing intended to improve the etched shape of the organic low dielectric constant material film and to prevent the deterioration in the film quality of the organic low dielectric constant material film is disclosed in Japanese Laid Open Patent Application (JP-P2001-35832A). In the second conventional technique, the mixed gas of a first gas containing one or both of hydrogen atoms and nitrogen atoms and a second gas in which phoshor, sulfur or silicon atoms are easily separated is used as an etching gas of the organic low dielectric constant material film. Oxygen from the etching gas is removed so as to protect the deterioration in the film quality in the organic low dielectric constant material film. When this mixed gas is used to etch the organic low dielectric constant material film, the phoshor, sulfur or silicon atoms are deposited on the sidewall of a pattern generated through the etching and polymerized to form a sidewall protection film. Due to the formation of the sidewall protection film, the second conventional technique enables the organic low dielectric constant material film to be anisotropically etched. The second conventional technique further discloses that since a nitrogen gas is added to the mixed gas serving as the etching gas, nitrogen is added to the formed sidewall protection film, thereby forming the stronger sidewall protection film.

Moreover, a third conventional technique for the organic film processing intended to provide an anisotropic etching method of the organic low dielectric constant material film with plasma is disclosed in Japanese Laid Open Patent Application (JP-P2000-269185A). In the third conventional technique, a mixed gas of oxygen gas and ammonium, a mixed gas of oxygen gas and water, a mixed gas of oxygen gas and methane and a mixed gas of oxygen gas and hydrogen gas are used as an etching gas. The usage of the etching gas as mentioned above enables a passivation layer to be formed on a sidewall of a pattern and enables anisotropic etching. The third conventional technique further discloses that a small rate of nitrogen may be arbitrarily added to the gas.

Moreover, a fourth conventional technique for the organic film processing intended to protect the organic low dielectric constant material and to keep the entire effective low dielectric constant of a device is disclosed in Japanese Laid Open Patent Application (JP-P2001-351976A). In the fourth conventional technique, one layer or two layers of sacrificial hard mask and a permanent hard mask are formed on an organic low dielectric constant material film. In order to form a dual damascene structure, three layers of hard masks are formed. The one layer or two layers of the sacrificial hard mask enable the formation of the permanent hard mask. The permanent hard mask protects the organic low dielectric constant material film and avoids the change in its dielectric constant. The fourth conventional technique discloses that for the etching of the organic low dielectric constant material film, Ar of 0 to 500 sccm, $C_4F_8$ of 0 to 20 sccm, $C_2F_6$ of 0 to 100 sccm, $CHF_3$ of 0 to 100 sccm, $CF_4$ of 0 to 100 sccm, $O_2$ of 0 to 100 sccm, $N_2$ of 0 to 100 sccm, CO of 0 to 100 sccm and $CO_2$ of 0 to 100 sccm are used for an etching gas.

As a typical etching technique, Japanese Laid Open Patent Application (JP-A-Heisei 7-193049) discloses an etching apparatus that can carry out the etching without charging up. Moreover, Japanese Laid Open Patent Application (JP-P2001-351897A) discloses a plasma etching apparatus that can surely accelerate electrons. However, those etching techniques are not intended to solve the problems peculiar to the organic low dielectric constant material.

DISCLOSURE OF THE INVENTION

An object of the present invention is to provide the technique for protecting an inter-layer insulating film made of organic low dielectric constant material from damage applied during a semiconductor process, reducing leak current of the inter-layer insulating film and improving the reliability of the semiconductor device.

Another object of the present invention is to provide the technique for protecting copper of a wiring from being diffused into an inter-layer insulating film made of organic low dielectric constant material.

Still another object of the present invention is to provide the technique for reducing a manufacturing step of a semiconductor device that uses copper for a wiring and uses organic low dielectric constant material for an inter-layer insulating film.

In one aspect of the present invention, the semiconductor device has an organic insulating film having an opening. The organic insulating film has a modified portion facing the opening. The modified portion includes nitrogen atoms. The above-mentioned modified layer has the mechanically strong structure and effectively protects the organic insulating film from the damage added in the semiconductor process.

In order to optimize the shape of the opening, in the course of the etching process, there may be a case that fluorine atoms must be mixed into the modified layer. In this case, the concentration of the above-mentioned fluorine atoms in the modified portion is desired to be lower than the concentration of the above-mentioned nitrogen atoms. The reduction in the concentration of the fluorine atoms suppresses the corrosion of a conductor embedded in the opening.

Since the modified layer functions as a diffusion barrier against copper, the above-mentioned semiconductor device is especially effective for the case that the metal conductor whose main component is copper is provided inside the above-mentioned opening.

The semiconductor device can be designed such that the metal conductor whose main component is copper is in direct contact with the modified portion, and the barrier film of copper is not installed between the metal conductor and the organic insulating film. Since the above-mentioned structure does not require the step of forming the barrier film, this is desired in view of the reduction in the number of the steps and the reduction in the cost.

On another aspect of the present invention, a manufacturing method of the semiconductor device includes:
(a) forming the organic insulating film on the top surface side of a substrate;
(b) etching the above-mentioned organic insulating film and forming the opening; and
(c) forming the modified portion including nitrogen atoms, at the position facing the above-mentioned opening of the above-mentioned organic insulating film.

The above-mentioned modified layer protects the organic insulating film from the damage added in the semiconductor process.

In the case that fluorine atoms are contained in the modified layer, from the viewpoint of preventing the corrosion of the conductor embedded in the opening, the concentration of the above-mentioned fluorine atoms is desired to be lower than the concentration of the above-mentioned nitrogen atoms.

In this case, since the etching of the opening as mentioned above is executed by using the etching gas containing the nitrogen gas and the fluoro-carbon, the above-mentioned (b) step and the above-mentioned (c) step can be carried out at the same time.

The fact that the molar ratio of the nitrogen gas contained in the etching gas is 50% or more of the entire etching gas is desired in view of enabling the formation of the modified layer having the high effect of protecting the organic insulating film. In order to form the preferable modified layer, the molar ratio of the above-mentioned nitrogen gas contained in the etching gas is further desired to be 70% or more of the entire etching gas.

When the etching gas including the nitrogen gas and the fluoro-carbon is used to etch the above-mentioned opening, the mechanism for alternately carrying out the induction and shutdown of the plasma induced for the etching is preferably in promoting the formation of the modified layer.

Also, the mechanism for alternately carrying out the supply and shutdown of the bias to the above-mentioned substrate during the execution of the above-mentioned (b) step is preferable in promoting the formation of the modified layer.

There may be a case that the above-mentioned (c) step is carried out by exposing the position facing the above-mentioned opening of the above-mentioned organic insulating film to the plasma including the nitrogen atoms, after the above-mentioned (b) step. The formation of the modified layer as mentioned above is preferable in that the formation of the modified layer can be made sure.

On still another aspect of the present invention, the manufacturing method of the semiconductor device includes:
(d) forming the organic insulating film; and
(e) etching the organic insulating film through the plasma including nitrogen atoms and forming the opening.

The above-mentioned (e) step alternately executes the supply and shutdown of the induction of the above-mentioned plasma. The manufacturing method of the semiconductor device as mentioned above forms the modified layer for protecting the organic insulating film. The mechanism for alternately executing the supply and shutdown of the induction of the plasma including the nitrogen atoms promotes the growth of the modified layer, at the position facing the above-mentioned opening of the organic insulating film.

On still another aspect of the present invention, the manufacturing method of the semiconductor device includes:
(d) forming the organic insulating film, on the top surface side of the substrate; and
(e) etching the organic insulating film through the plasma including nitrogen atoms and forming the opening.

During the execution of the above-mentioned (e) step, the supply and shutdown of the bias to the substrate is alternately executed. The alternate execution of the supply and shutdown of the bias to the substrate promotes the growth of the modified layer, at the position facing the opening of the organic insulating film.

On still another aspect of the present invention, the manufacturing method of the semiconductor device includes:
(f) forming the organic insulating film;
(g) etching the organic insulating film and forming the opening; and
(h) exposing the organic insulating film to the plasma including the nitrogen atoms after forming the above-mentioned opening.

The manufacturing method of the semiconductor device as mentioned above grows the modified layer for protecting the organic insulating film, at the position facing the opening of the organic insulating film.

On still another aspect of the present invention, the manufacturing method of the semiconductor device includes:
(i) forming a first inter-layer insulating film made of an organic compound;
(j) forming a second inter-layer insulating film made of an organic compound, on the top surface side of the above-mentioned first inter-layer insulating film;
(k) forming a wiring groove which the above-mentioned second inter-layer insulating film penetrates, and a via hole which the above-mentioned first inter-layer insulating film penetrates, by using one etching process;
(l) forming the modified portions including the nitrogen atoms, on the sidewall of the above-mentioned wiring groove and the sidewall of the above-mentioned via hole; and
(m) embedding the above-mentioned wiring groove and the above-mentioned via hole with conductors.

The manufacturing method of the semiconductor device as mentioned above can reduce the semiconductor process executed until the formation of the conductors, after the formation of the modified portion. For this reason, in the situation that the damage in the formed modified portion is little, the conductors can be embedded in the above-mentioned wiring groove and the above-mentioned via hole.

There may be a case that the fluorine atoms are included in the modified layer. In this case, the concentration of the above-mentioned fluorine atoms is desired to be lower than the concentration of the above-mentioned nitrogen atoms.

Since the etching of the opening as mentioned above is executed by using the etching gas including the nitrogen gas and the fluoro-carbon, the above-mentioned (l) step and the above-mentioned (k) step can be carried out at the same time.

As mentioned above, the present invention provides the technique for protecting the inter-layer insulating film made of the organic low dielectric constant material from the damage applied in the semiconductor process and attaining the drop in the leak current of the inter-layer insulating film and the improvement of the reliability of the semiconductor device.

Also, the present invention provides the technique to avoid the copper configuring the wiring from being diffused into the inter-layer insulating film made of the organic low dielectric constant material.

Also, the present invention provides the technique for reducing the manufacturing step of the semiconductor device, in which the cupper is used for the wiring, and the organic low dielectric constant material is used for the inter-layer insulating film.

BRIEF DESCRIPTION OF DRAWINGS

FIG. 9 is a diagram showing a difference between in composition between a modified layer 5a and an attachment layer 12;

FIG. 12 shows a course when nitrogen plasma is irradiated to form a modified layer 5a;

FIG. 13 shows a course when the nitrogen plasma is irradiated to form the modified layer 5a;

BEST MODE FOR CARRYING OUT THE INVENTION

Embodiments of a semiconductor device and a manufacturing method for the same according to the present invention will be described below with reference to the attached drawings.

FIRST EMBODIMENT

Figure 1:
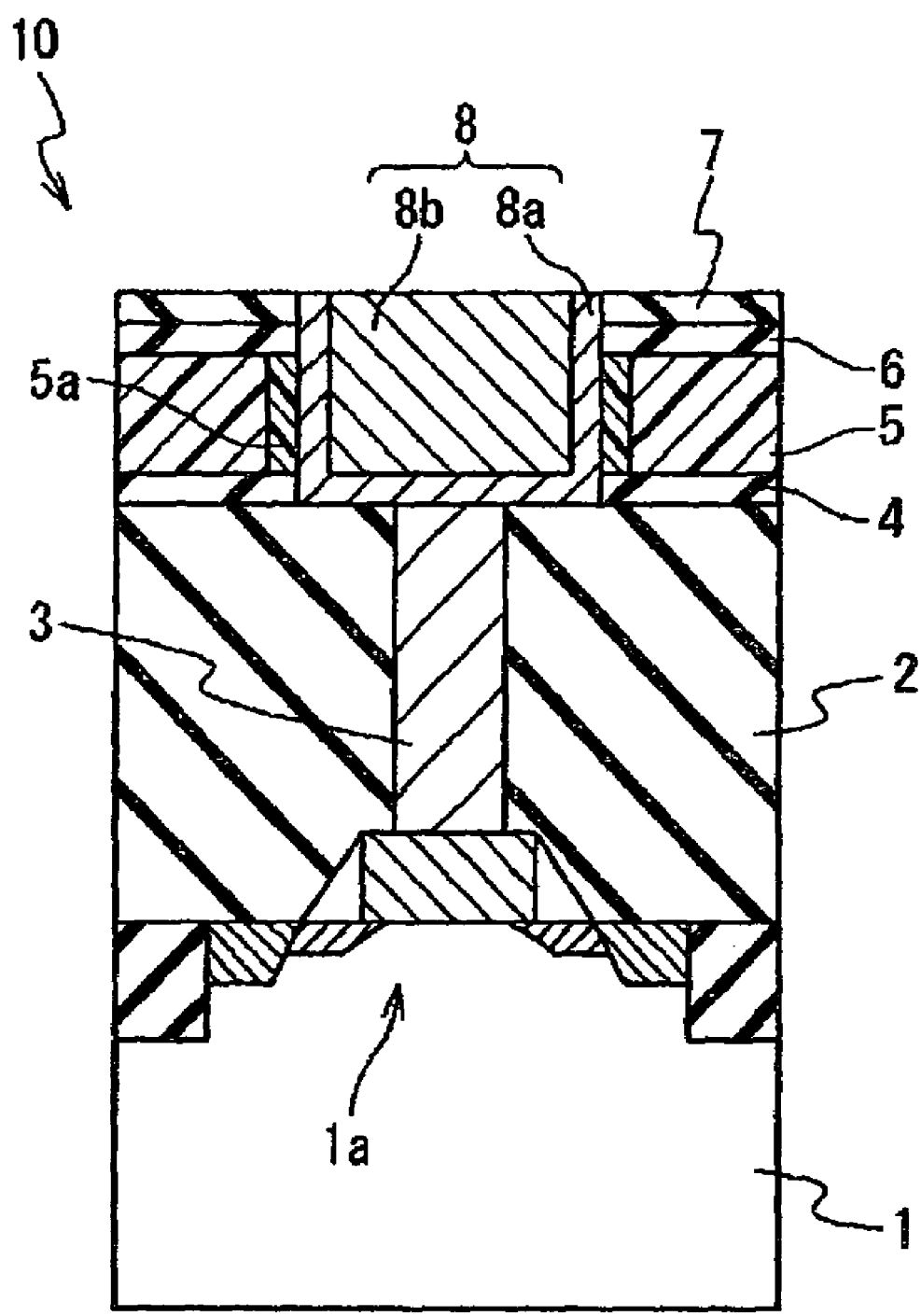
FIG. 1 is a cross sectional view showing a semiconductor device according to a first embodiment of the present invention.

FIG. 1 shows a semiconductor device 10 of the first embodiment of the present invention. The semiconductor device 10 has a semiconductor substrate 1 in which a MOS transistor 1a is formed on the surface. The semiconductor substrate 1 is covered with an inter-layer insulating film 2. A conductive plug 3 is formed in the inter-layer insulating film 2 to pass through the inter-layer insulating film 2 to the MOS transistor 1a.

A silicon nitride film 4, an organic insulating film 5, a silicon oxide film 6 and a silicon nitride film 7 are sequentially formed on the inter-layer insulating film 2. The silicon nitride film 4 is an etching stopper used in etching the organic insulating film 5. The organic insulating film 5 is made of organic low dielectric constant material whose dielectric constant is low, and it is typically made of the di-vinyl-siloxane benzo cyclobutene (BCB) polymer. The dielectric constant of the organic insulating film 5 made of the BCB film is between 2.4 and 2.7. For the organic insulating film 5, it is possible to use hydrocarbon-based polymer such as poly-phenylene, polyallyere ether, and polyallylene, organic silica such as methyl silica, and other organic materials. The silicon oxide film 6 and the silicon nitride film 7 are dual hard masks used in etching the organic insulating film 5.

A wiring groove is formed in the silicon nitride film 4, the organic insulating film 5, the silicon oxide film 6 and the silicon nitride film 7 to pass through them to the inter-layer insulating film 2. A copper wiring 8 is formed in the wiring groove. The copper wiring 8 includes a barrier film 8a for covering the bottom surface and side of the wiring groove and a copper film 8b. The barrier film 8a is composed of a tantalum film (not shown) for covering the bottom surface and the side of the wiring groove, and a nitride tantalum film (not shown) for covering the tantalum film. In the copper film 8b, the copper is a main component. The copper film 8b is formed such that the copper film 8b fills the wiring groove on the barrier film 8a.

A modified layer 5a is formed in a portion of the organic insulating film 5 which is contact with the barrier film 8a. As described later, the modified layer 5a is formed while the organic insulating film 5 is etched by using the etching gas containing nitrogen gas and $C_4F_8$. Thus, the modified layer 5a includes carbon atoms, nitrogen atoms and fluorine atoms. Many carbon-nitrogen bonds are formed in the modified layer 5a including many carbon atoms and nitrogen atoms.

The modified layer 5a, in which the many carbon-nitrogen bonds are formed, has a structure that is mechanically chemically strong. Moreover, the insulating property of the modified layer 5a is good. The modified layer 5a having such property prevents the diffusion of copper from the copper wiring 8, and reduces leak current flowing through the organic insulating film 5 from the copper wiring 8.

On the other hand, a fluorine concentration in the modified layer 5a is made low so as not to cause corrosion of the copper wiring 8, and the fluorine concentration is set to be lower than a nitrogen concentration. Such a modified layer 5a effectively protects the organic insulating film 5 without causing the corrosion of the copper wiring 8.

It should be noted that the modified layer 5a is not an etching attachment formed from carbon and fluorine emitted into plasma in the etching of the organic insulating film 5 and attached to the sidewall of the organic insulating film 5. The etching attachment attached on the sidewall of the organic insulating film 5 during the etching that uses the etching gas containing the nitrogen atoms and the $C_4F_8$ is an organic polymer containing nitrogen atoms and fluorine atoms. This etching attachment includes many fluorine atoms, and the fluorine concentration is higher than the nitrogen concentration. This etching attachment causes the copper of the wiring to be corroded during the manufacturing process of the semiconductor device 10. Thus, it is substantially perfectly removed in an organically rinsing step.

FIGS. 2 to 8 show the manufacturing method of the semiconductor device in the first embodiment. As shown in FIGS. 2 to 8, in this embodiment, a single damascene technique is used to form the wiring.

Figure 2:
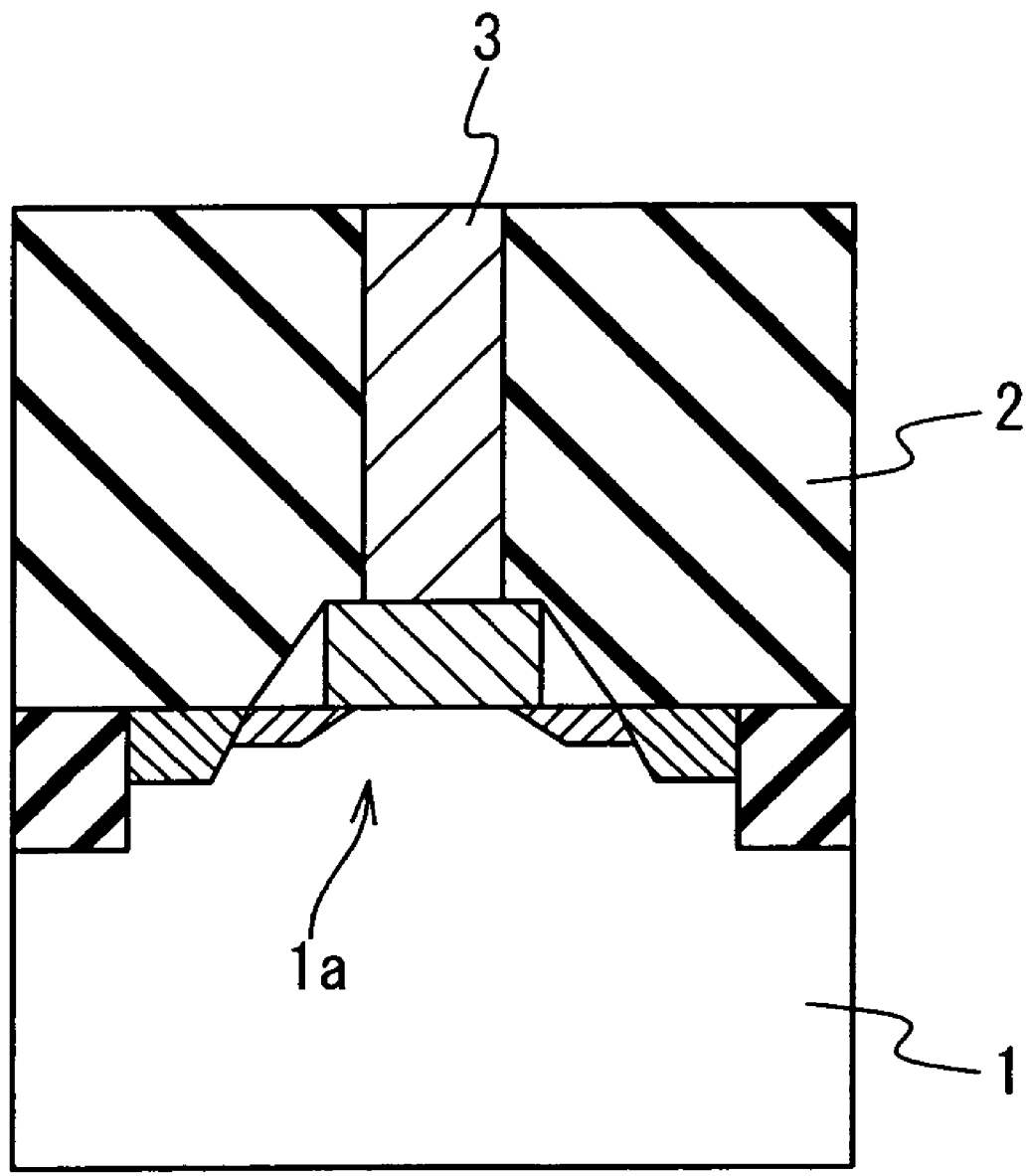
FIG. 2 is a cross sectional view showing a manufacturing method of the semiconductor device in the first embodiment.

As shown in FIG. 2, after the MOS transistor 1a is formed on the surface of the semiconductor substrate 1, the semiconductor substrate 1 is covered by the inter-layer insulating film 2. Moreover, the plug 3 is formed in the inter-layer insulating film 2 to pass through the inter-layer insulating film 2 to the MOS transistor 1a.

Figure 3:
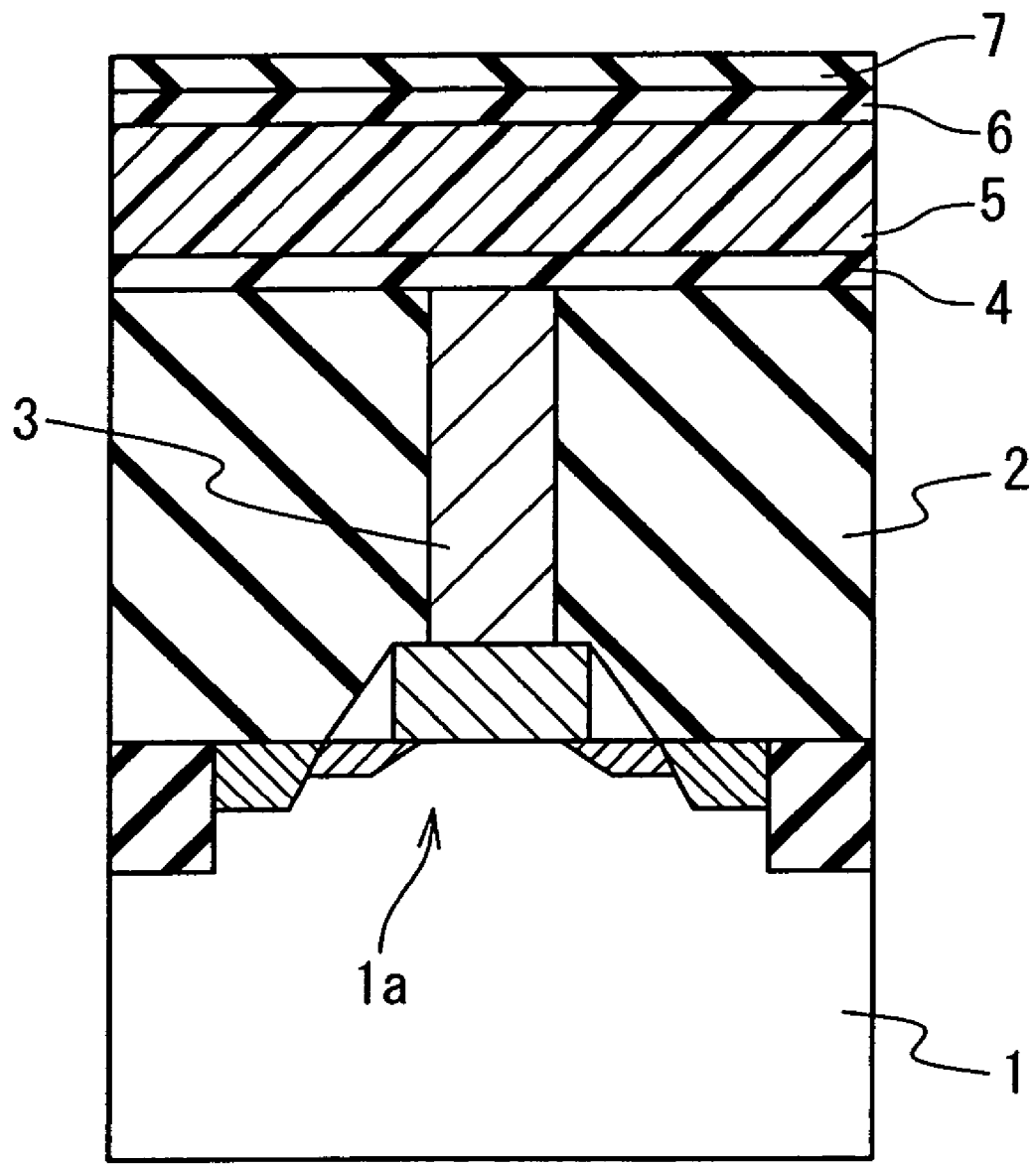
FIG. 3 is a cross sectional view showing the manufacturing method of the semiconductor device in the first embodiment.

After the formation of the plug 3, as shown in FIG. 3, the silicon nitride film 4, the organic insulating film 5, the silicon oxide film 6 and the silicon nitride film 7 are sequentially formed on the entire surface of the top surface side of the semiconductor substrate 1.

Figure 4:
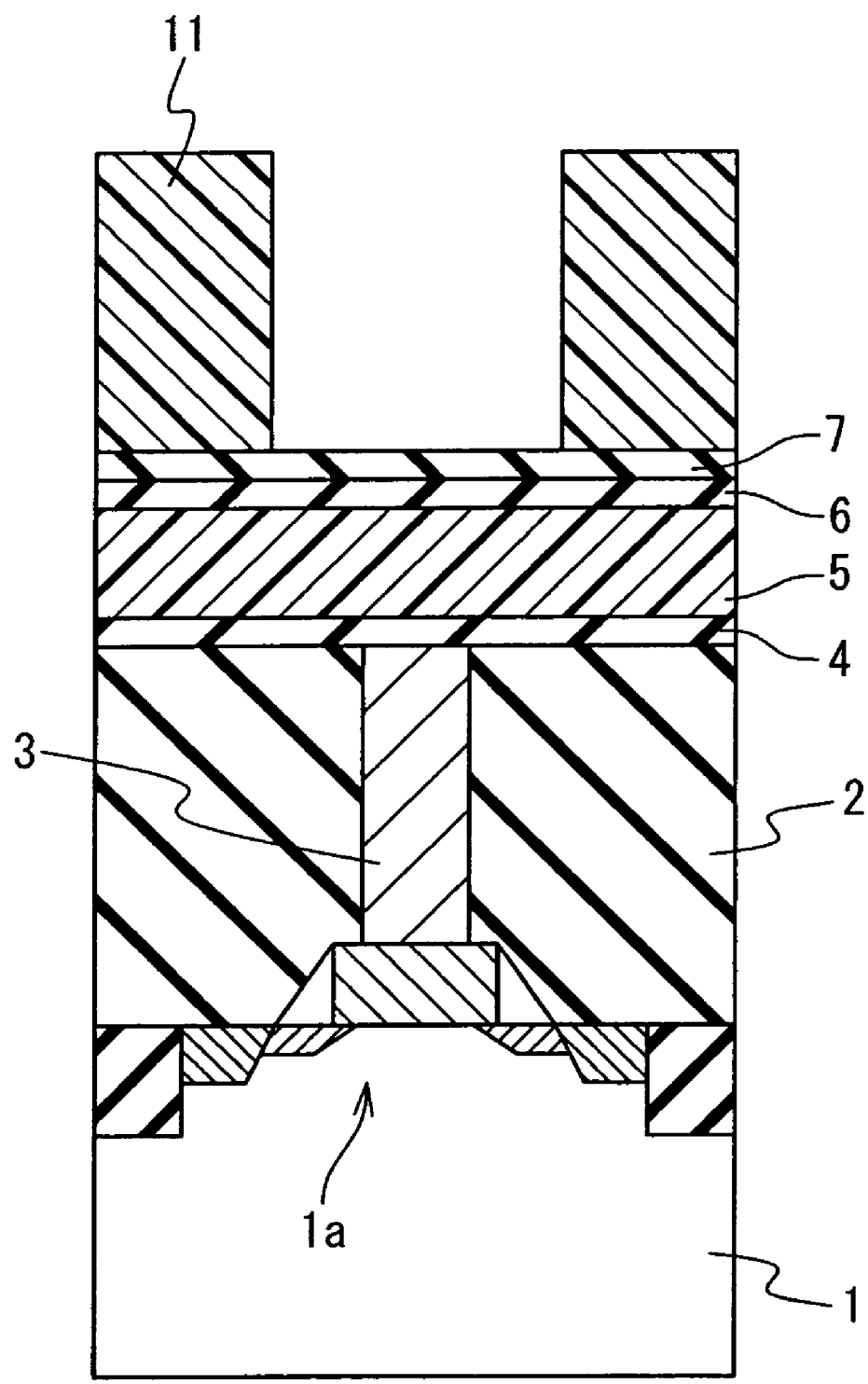
FIG. 4 is a cross sectional view showing the manufacturing method of the semiconductor device in the first embodiment.

After the formation of the silicon nitride film 7, as shown in FIG. 4, a photo resist mask 11 is formed on the silicon nitride film 7 by using a photolithography technique.

Figure 5:
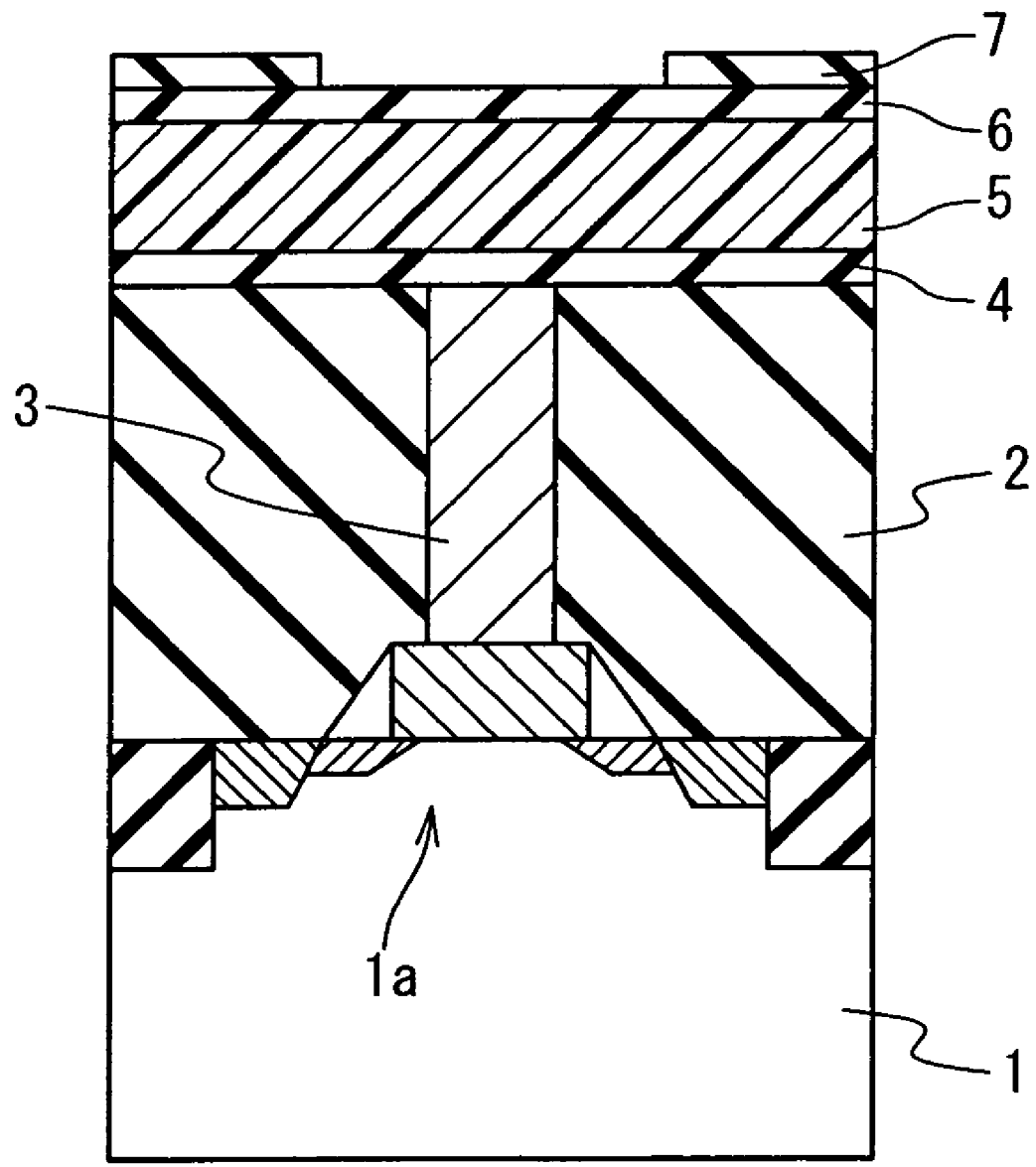
FIG. 5 is a cross sectional view showing the manufacturing method of the semiconductor device in the first embodiment.

Subsequently, the formed photo resist mask 11 is used to etch the silicon nitride film 7. In etching the silicon nitride film 7, the mixed gas of $CH_2F_2$, argon and oxygen gas ($O_2$) is used as an etching gas. In etching the silicon nitride film 7, a part of the silicon oxide film 6 may be etched but the organic insulating film 5 must not be exposed. After the etching of the silicon nitride film 7, oxygen plasma is used in such a way that the ashing is carried out, and the photo resist mask 11 is removed as shown in FIG. 5.

After the removal of the photo resist mask 11, the silicon oxide film 6 is etched by using the silicon nitride film 7 as a mask. The formation of a dual hard mask is completed by etching the silicon oxide film 6 and is used in etching the organic insulating film 5.

Figure 6:
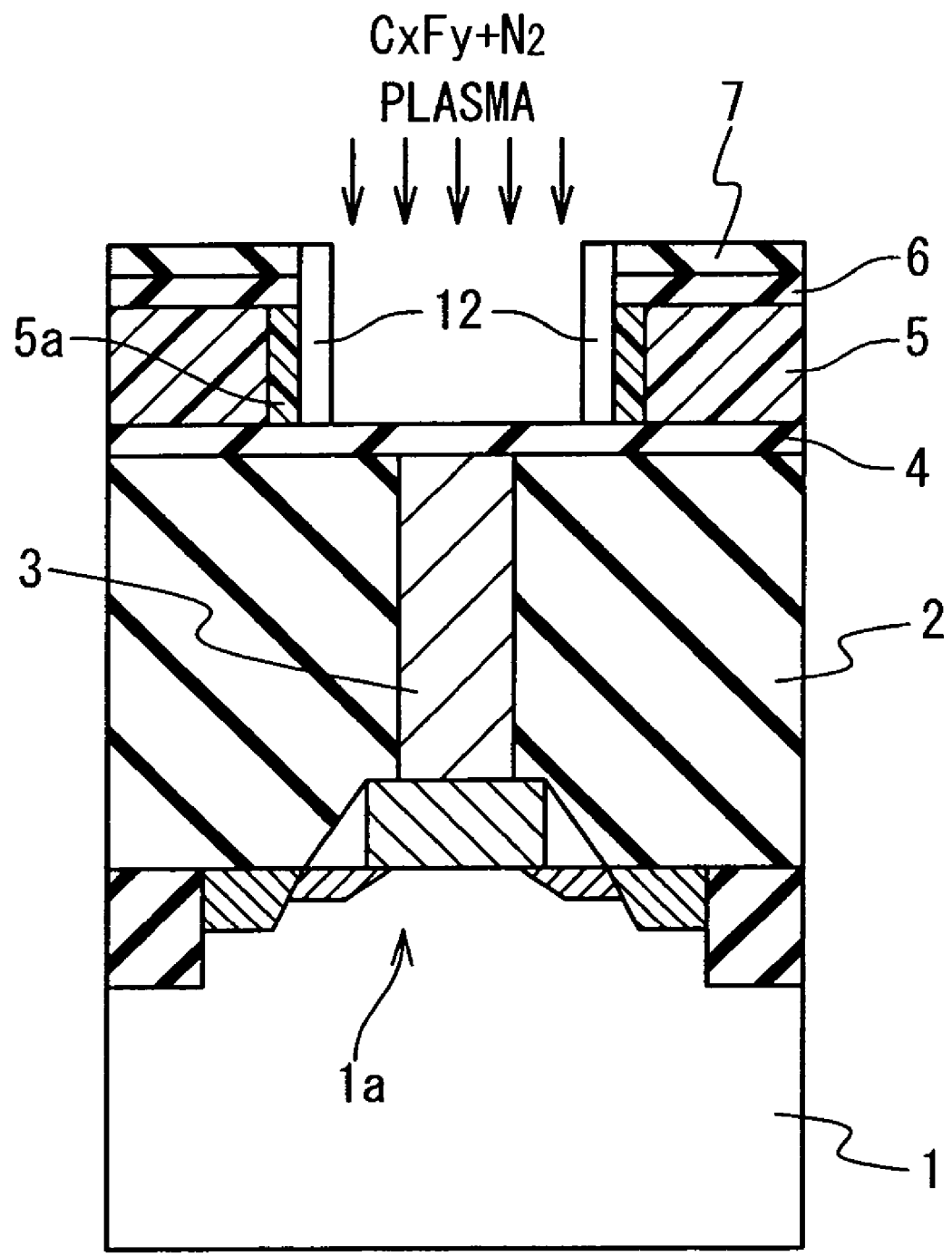
FIG. 6 is a cross sectional view showing the manufacturing method of the semiconductor device in the first embodiment.

After the etching of the silicon oxide film 6, as shown in FIG. 6, the organic insulating film 5 is etched by using the silicon oxide film 6 and the silicon nitride film 7 as the dual hard mask.

In etching the organic insulating film 5, the etching gas is used in which the $C_4F_8$, nitrogen gas ($N_2$) and oxygen gas ($O_2$) are mixed. The main component of the etching gas used in etching the organic insulating film 5 is the nitrogen gas. Since the organic insulating film 5 is etched by using the etching gas whose main component is the nitrogen gas, nitrogen radicals contained in plasma are implanted into the organic insulating film 5, so that the modified layer 5a is formed. The modified layer 5a to which the nitrogen is added is mechanically and chemically stable, and its insulating property is good. Such a modified layer 5a effectively protects the organic insulating film 5. In order to effectively form the modified layer 5a, the molar ratio of the nitrogen gas contained in the etching gas is desired to be 50% or more of the whole. Preferably, the molar ratio of the nitrogen gas is desired to be 70% or more of the whole.

On the other hand, since $C_4F_8$ is added to the etching gas, the anisotropic etching of the organic insulating film 5 is attained. In etching the organic insulating film 5, a different fluoro-carbon can be used instead of the $C_4F_8$. However, the usage of the fluoro-carbon in which the number of carbons contained in one molecule is 2 or more, such as the $C_4F_8$, is desired from the viewpoint of making the anisotropy of the etching higher.

When the etching gas having such composition is used to etch the organic insulating film 5, the modified layer 5a is formed, and at the same time, the carbon atoms, fluorine atoms and nitrogen atoms in the plasma are deposited on the sidewalls of the organic insulating film 5, silicon oxide film 6 and silicon nitride film 7, and a deposit layer 12 is formed. The deposit layer 12 carries out the role of attaining the anisotropic etching of the organic insulating film 5.

In order to examine the composition of the deposit layer 12 and modified layer 5a, the inventor used the etching gas, in which the $C_4F_8$, the nitrogen gas and the oxygen gas were mixed, and carried out an experiment to etch the surface portion of the BCB film. In this experiment, the flow rates of the $C_4F_8$, nitrogen gas and oxygen gas, which were introduced into the chamber where the etching was carried out, were 10 sccm, 150 sccm and 30 sccm, respectively. Thus, the molar ratio of the nitrogen ($N_2$) to the entire etching gas was 79%. Moreover, after the etching, the BCB film was rinsed or washed. The composition on the surface portion of the BCB film immediately after the etching and the composition on the surface portion of the BCB film immediately after the rinsing were analyzed by using XPS (X-ray Photoelectron Spectroscopy). The composition on the surface portion of the BCB film immediately after the etching corresponds to the composition of the deposit layer 12, and the composition on the surface portion of the BCB film after the rinsing corresponds to the modified layer 5*a*.

As shown in FIG. 9, the signal intensities of the carbon, fluorine and nitrogen, which were obtained from the surface of the BCB film immediately after the etching, were 5151, 2189 and 626 (a.u.), respectively. This means that the fluorine concentration of the etching attachment remaining on the surface of the BCB film after the etching is higher than the nitrogen concentration. That is, the table of FIG. 9 indicates that the fluorine concentration of the deposit layer 12 of the etching attachment is higher than the nitrogen concentration.

On the other hand, the signal intensities of the carbon, fluorine and nitrogen, which were obtained from the surface of the BCB film after it was rinsed and the etching attachment was removed, were 5976, 461 and 573 (a.u.), respectively. This means that nitrogen was added to the surface portion of the BCB film, due to the etching of the BCB film in which the etching gas containing the nitrogen gas was used. That is, this means that the nitrogen was added to the modified layer 5*a*, due to the etching of the organic insulating film 5 in which the etching gas containing the nitrogen gas was used. Moreover, the fluorine concentration on the surface portion of the BCB film after the rinsing is lower than the nitrogen concentration. That is, the table of FIG. 9 indicates that the fluorine concentration of the modified layer 5*a* is lower than the nitrogen concentration.

In this way, in the modified layer 5*a* and deposit layer 12 which are formed by etching the organic insulating film 5, their compositions are different. The modified layer 5*a* in which the nitrogen concentration is high and the fluorine concentration is low is used to protect the organic insulating film 5. The deposit layer 12 in which the fluorine concentration is high causes the corrosion of the copper wiring 8, is removed by the organic rinsing which will be described later.

The etching of the organic insulating film 5 is carried out until the silicon nitride film 4 serving as the etching stopper is exposed, and is stopped on the top surface of the silicon nitride film 4.

Figure 7:
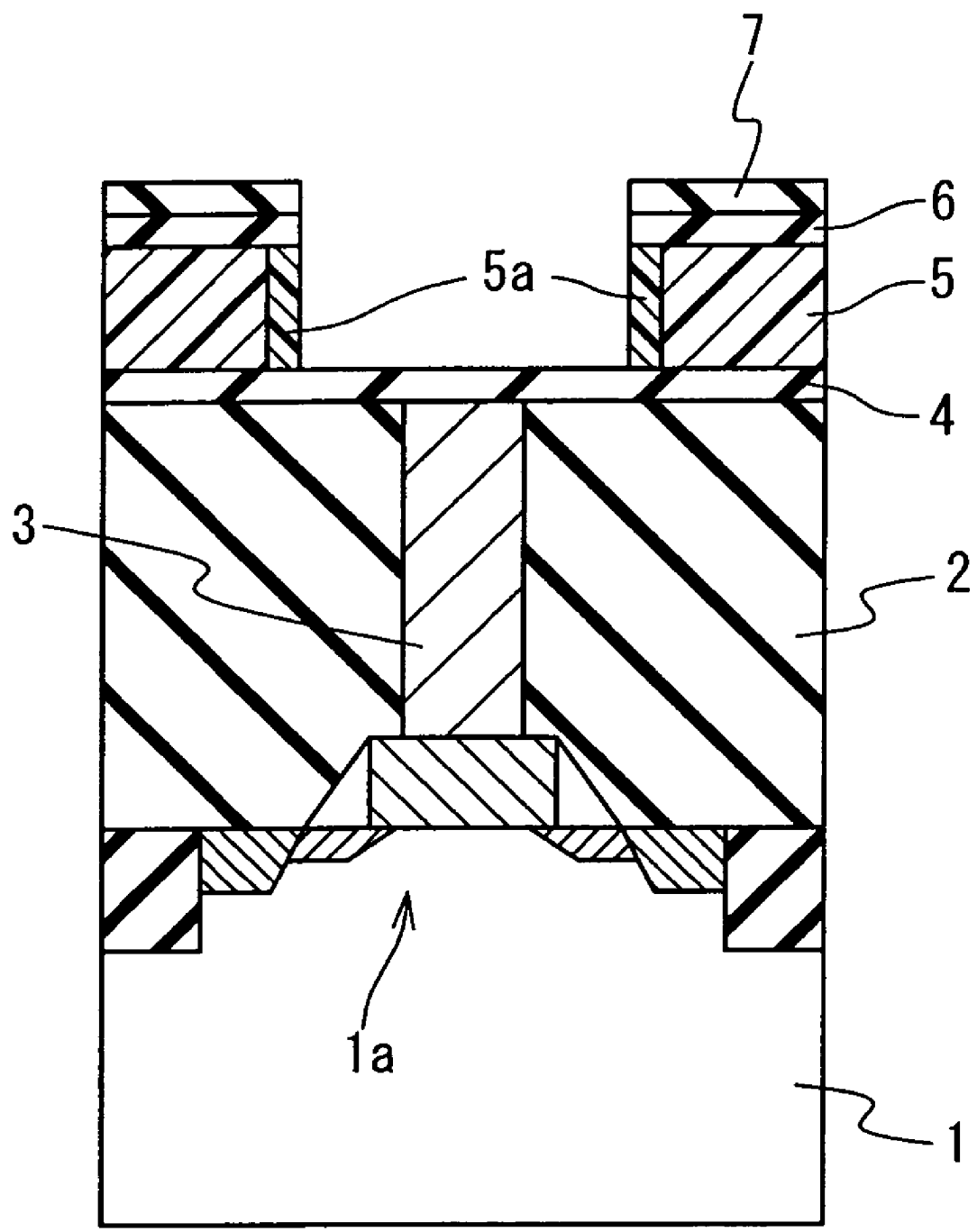
FIG. 7 is a cross sectional view showing the manufacturing method of the semiconductor device in the first embodiment.

After the etching of the organic insulating film 5, as shown in FIG. 7, the deposit layer 12 is substantially perfectly removed through the organic rinsing step. Thus, the corrosion of the copper wiring 8 in FIG. 1 is avoided.

Figure 8:
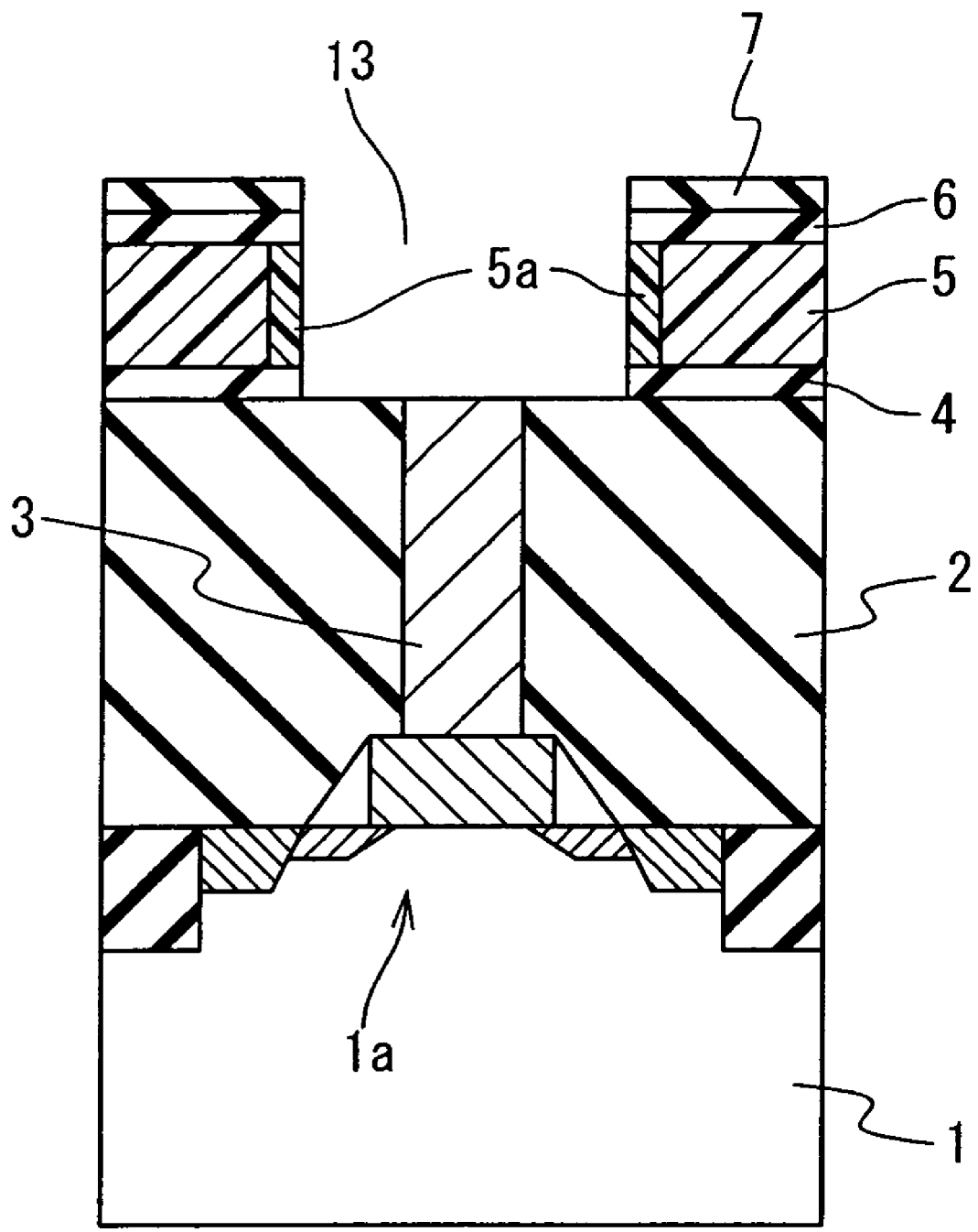
FIG. 8 is a cross sectional view showing the manufacturing method of the semiconductor device in the first embodiment.

Subsequently, under the condition that the silicon nitride film is etched, the entire surface of the top surface side of the semiconductor substrate 1 is etched back, and as shown in FIG. 8, the portion where the silicon nitride film 4 is exposed is etched. At the time of the etch-back to etch the silicon nitride film 4, the above-mentioned modified layer 5*a* protects the organic insulating film 5 and avoids the deterioration in the insulating property of the organic insulating film 5.

The silicon nitride film 7 is also etched at the time of etching the silicon nitride film 4. However, when the organic insulating film 5 and silicon nitride film 7 in FIG. 3 are formed, the film thickness of the silicon nitride film 7 is formed thicker than the film thickness of the organic insulating film 5, and the silicon nitride film 7 is not perfectly removed.

Etching the silicon nitride film 4 forms a wiring groove 13 where the copper wiring 8 is formed. The plug 3 is exposed to the wiring groove 13 to permit the electric connection to the plug 3.

Subsequently, the barrier film 8*a* and the copper film 8*b* are embedded in the wiring groove 13, and the copper wiring 8 is formed. The copper wiring 8 is formed by the copper wiring embedding technique for using copper plating and CMP (Chemical Mechanical Polishing) which is known to one skilled in the art. At the time of the CMP, since the silicon oxide film 6 and silicon nitride film 7 of the dual hard mask are more removed, it is effective for the decrease of the effective dielectric constant of the inter-layer insulating film. When the copper wiring 8 is formed, the formation of the semiconductor device 10 shown in FIG. 1 is ended.

As explained above, in the first embodiment, the modified layer 5*a* to which nitrogen is added is formed on the sidewall of the organic insulating film 5. The modified layer 5*a* has the structure that is mechanically and chemically strong, and avoids the organic insulating film 5 from damage applied in the semiconductor process. Moreover, the modified layer 5*a* prevents copper from being diffused from the copper wiring 8, and reduces the leak current flowing through the organic insulating film 5 from the copper wiring 8.

Figure 10:
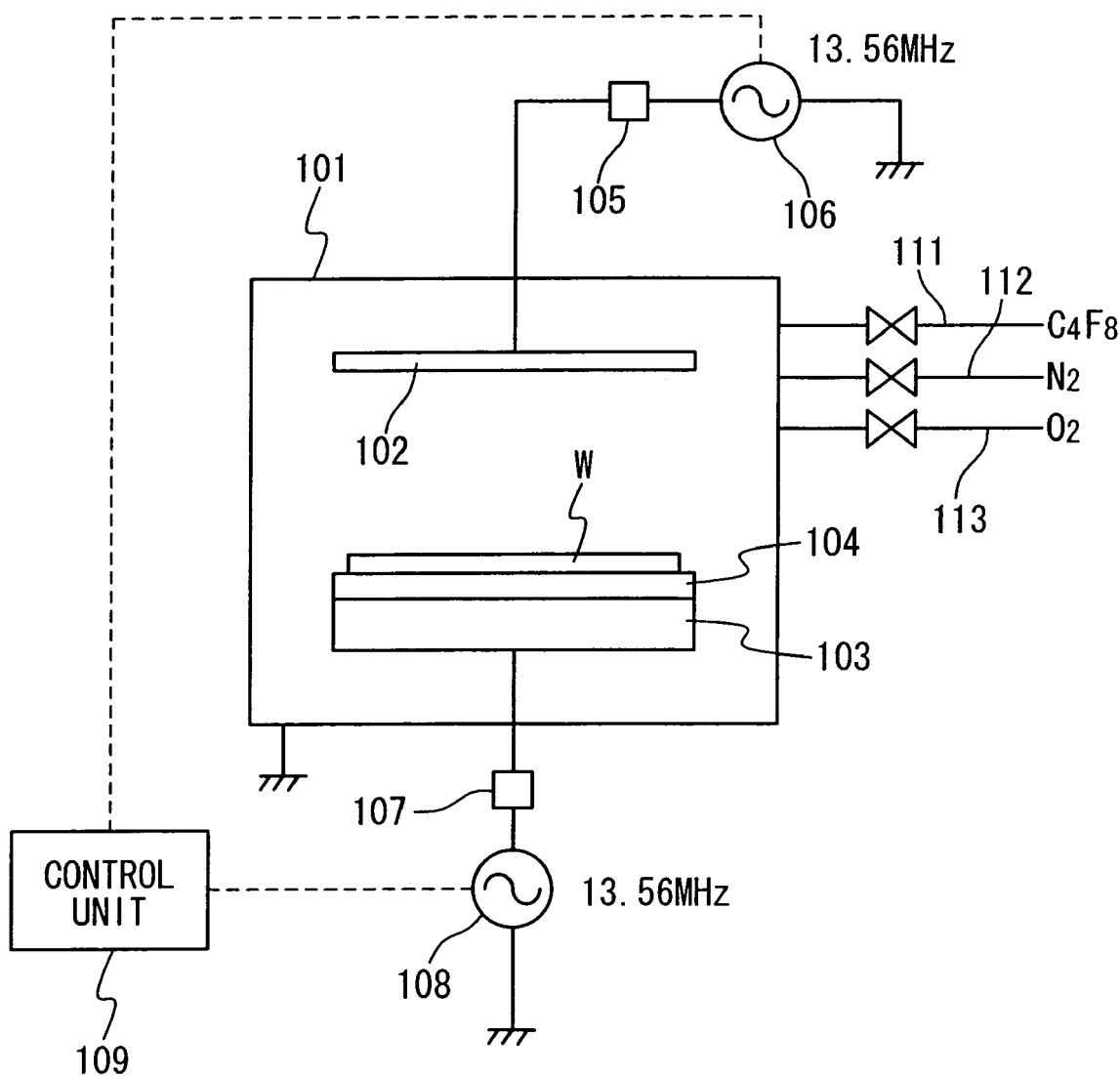
FIG. 10 shows an example of an etching apparatus for etching an organic insulating film 5.

In the first embodiment, in etching the organic insulating film 5, the discharging to induce the plasma is desired to be executed intermittently. FIG. 10 shows an example of an etching apparatus for intermittently executing the discharging to induce the plasma. The etching apparatus includes a chamber 101 where the etching is carried out. A fluoro-carbon gas supply line 111, a nitrogen gas supply line 112 and an oxygen gas supply line 113 are connected to the chamber 101. The fluoro-carbon gas supply line 111 supplies $C_4F_8$ to the chamber 101, the nitrogen gas supply line 112 supplies the nitrogen gas ($N_2$) to the chamber 101, and the oxygen gas supply line 113 supplies the oxygen gas ($O_2$) to the chamber 101.

The etching apparatus in FIG. 10 is a parallel flat etching apparatus. A upper electrode 102 and a lower electrode 103 opposing to each other are placed inside the chamber 101. An electrostatic chuck 104 for holding a wafer W is connected to the lower electrode 103. In etching the organic insulating film 5, the above-mentioned semiconductor substrate 1 as the wafer W is placed on the electrostatic chuck 104.

The upper electrode 102 is connected through a matching unit 105 to a high frequency power supply 106. The lower electrode 103 is connected through a matching unit 107 to a high frequency power supply 108. The high frequency power supply 106 is used to induce the plasma inside the chamber 101, and the high frequency power supply 108 is used to apply the bias to the wafer W. Both of the high frequency power supply 106 and the high frequency power supply 108 output a high frequency power of 13.56 MHz. The high frequency power supply 106 and the high frequency power supply 108 are controlled by a controller 109. The controller 109 controls the supply and shutdown of the high frequency voltage to the upper electrode 102 by the high frequency power supply 106, and further controls the supply and shutdown of the bias to the wafer W by the high frequency power supply 108.

Figure 11:
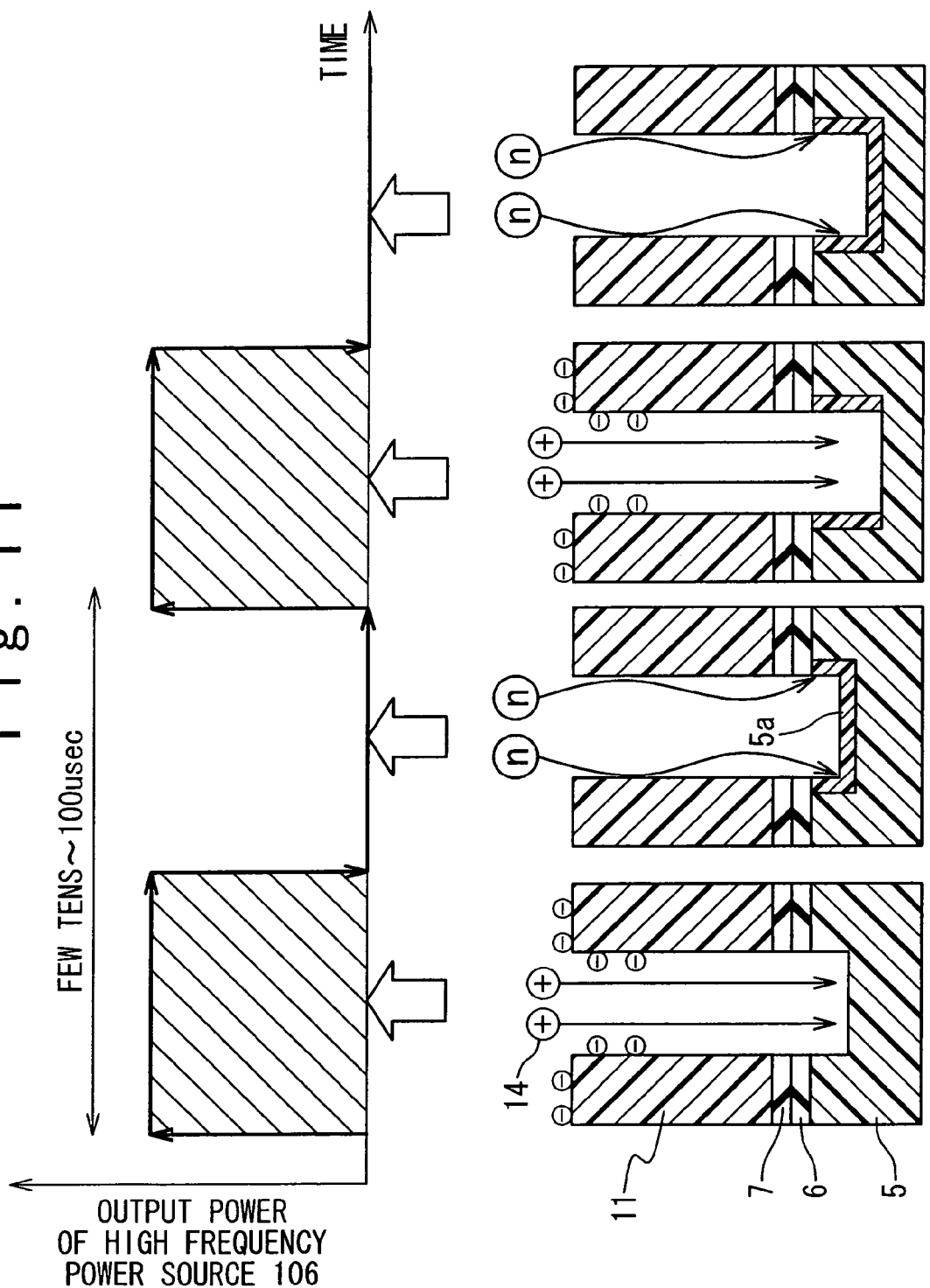
FIG. 11 shows a course of the etching of the organic insulating film 5 when discharging is intermittently executed.

In etching the organic insulating film 5, when the high frequency power supply 106 intermittently supplies the high frequency power to the upper electrode 102, the discharging is intermittently induced inside the chamber 101. FIG. 11 shows a course of the etching of the organic insulating film 5, when the discharging is intermittently carried out.

In the period while the discharging is carried out, the discharging results in the generation of the positive ions in the plasma. The organic IDL 5 is etched by the generated positive ions. At this time, the energy of the electron in the plasma is very high, as compared with the energy of the ion. Thus, the electrons are accumulated in the photo resist mask 11. For this reason, a charging separation state in which only the positive ions can be inputted appears in the organic insulating film 5.

When the discharging is shut down, the energy of the electron is sharply reduced in 10 to several 10 μs, and the potential difference between the plasma and the organic insulating film 5 is reduced. For this reason, the energy of the ions inputted to the organic insulating film 5 becomes very low, and neutral radicals and etching product are deposited on the sidewall and etching surface of the organic insulating film 5. While the neutral radicals and the etching product are deposited, the nitrogen radicals are diffused into the organic insulating film 5, and the sidewall of the organic insulating film 5 is nitrided, thereby growing the modified layer 5a. Even if the discharging is continuously carried out, the sidewall of the organic insulating film 5 is nitrided. However, since the intermittent discharging is carried out, the growth of the modified layer 5a is promoted.

One continuation period of discharging is desired to be 10 to 500 μs. If the continuation period of the discharging is long, the discharging becomes stable. However, if the continuation period of the discharging becomes longer than 500 μs, the effect of the shutdown of the discharging is reduced. On the other hand, if the continuation period of the discharging is shorter than 10 μs, the discharging doe not become stable.

On the other hand, a shutdown period while the discharging is stopped is desired to be 10 to 500 μs. If the shutdown period of the discharging is shorter than 10 μs, an electron temperature is not substantially dropped, which weakens the effect of the shutdown of the discharging. On the other hand, if the shutdown period of the discharging is longer than 500 μs, the discharging does not become stable.

Also, in the first embodiment, in etching the organic insulating film 5, the application of the bias to the semiconductor substrate 1 is desired to be intermittently carried out. When the etching apparatus in FIG. 10 is used to etch the organic insulating film 5, the intermittent supply of the high frequency power to the upper electrode 104 from the high frequency power supply 108 enables the bias to be intermittently applied to the semiconductor substrate 1.

While the bias is applied to the semiconductor substrate 1, similarly to FIG. 11, the electrons are accumulated in the photo resist mask 11, and the charging separation state appears.

When the application of the bias to the semiconductor substrate 1 is shut down, the potential difference between the organic insulating film 5 and the plasma to attract the positive ions is reduced which decreases the energy of the ions inputted to the organic insulating film 5. When the energy of the ions is decreased, the etching rate of the sidewall of the organic insulating film 5 is reduced, which easily causes the nitration on the sidewall of the organic insulating film 5. Thus, the growth of the modified layer 5a is promoted.

In this way, the intermittent application of the bias to the semiconductor substrate 1 promotes the growth of the modified layer 5a.

The promotion of the growth of the modified layer 5a resulting from the intermittent application of the bias to the semiconductor substrate 1 can be carried out simultaneously with the promotion of the growth of the modified layer 5a resulting from the intermittent discharging, as mentioned above.

Figure 12:
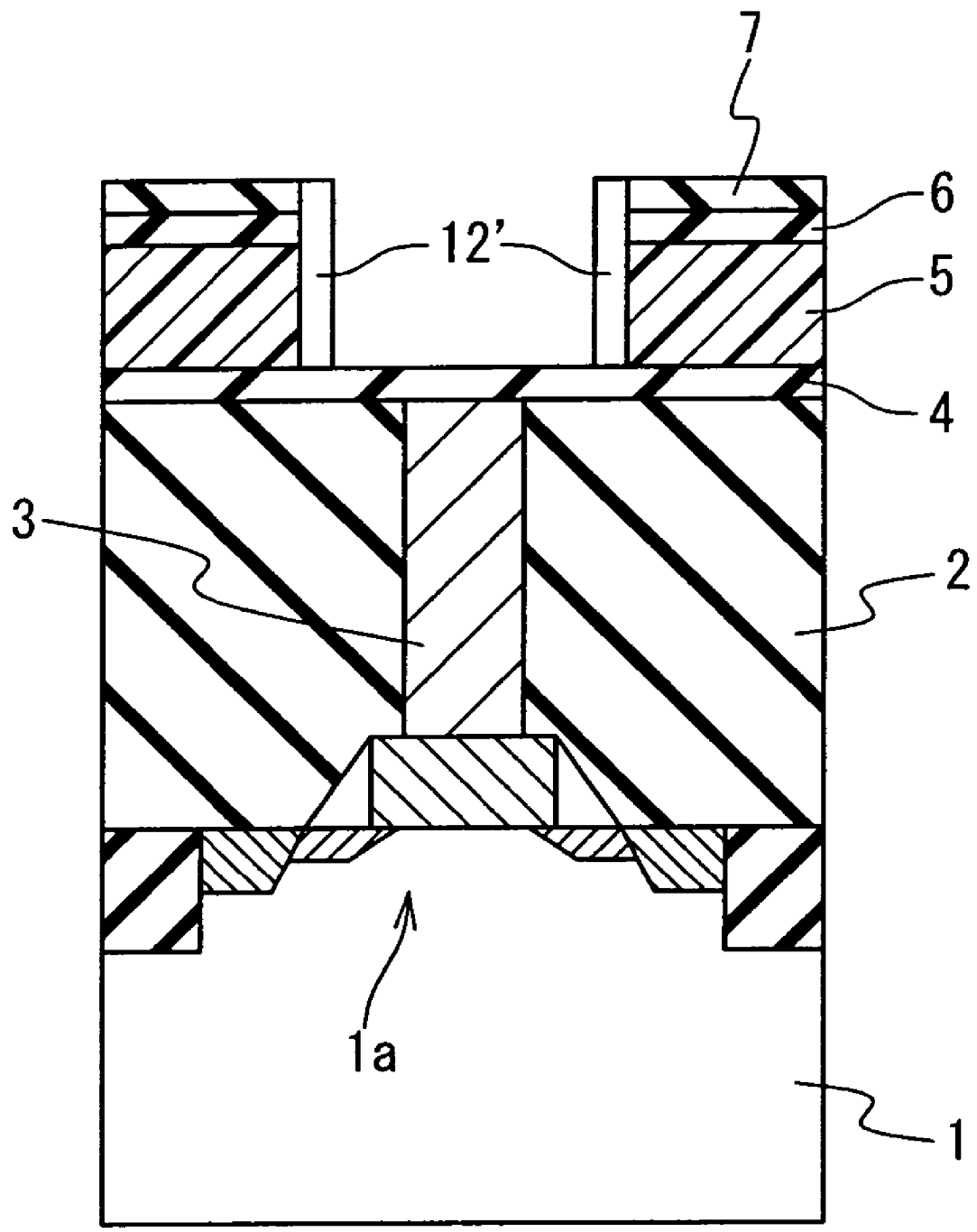
Figure 13:
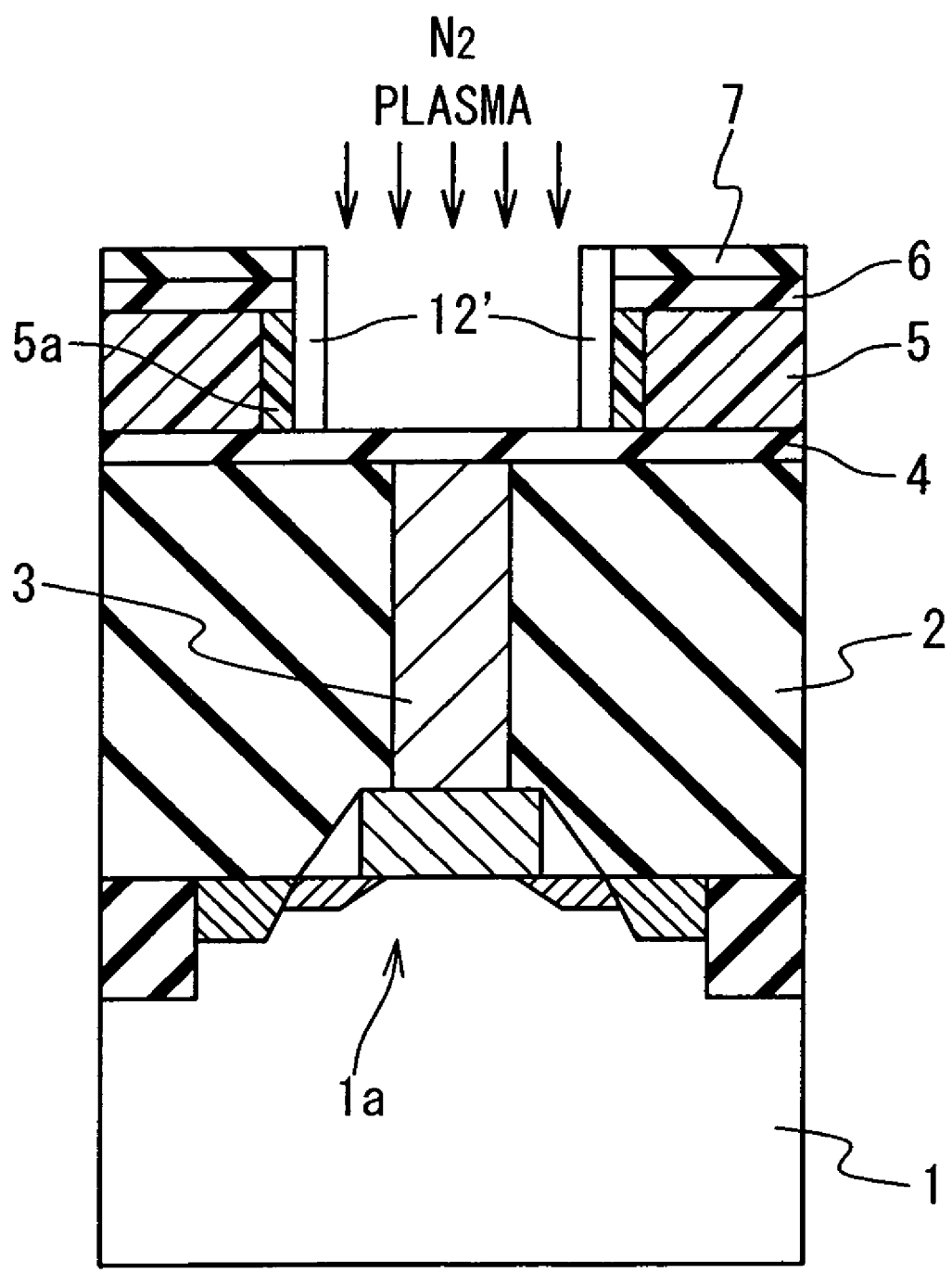

Also, in the first embodiment, the growth of the modified layer 5a can be executed by irradiating the nitrogen plasma to the top surface side of the semiconductor substrate 1, after the etching of the organic insulating film 5. In this case, as shown in FIG. 12, the etching gas containing the fluoro-carbon is used to etch the organic insulating film 5. By etching the organic insulating film 5, the etching attachment 12' is attached on the sidewalls of the organic insulating film 5, silicon oxide film 6 and silicon nitride film 7. After that, as shown in FIG. 13, the nitrogen plasma is irradiated before the removal of the etching attachments 12' through the organic rinsing. Due to the irradiation of the nitrogen plasma, the modified layer 5a is grown on the sidewall of the organic insulating film 5. The growth of the modified layer 5a through the irradiation of the nitrogen plasma is desired in that the growth of the modified layer 5a can be surely attained.

The irradiation of the nitrogen plasma can be also carried out after the removal of the etching attachments 12. In this case, the protection of the organic insulating film 5 from the organic rinsing solution used for the organic rinsing is not carried out. However, it is possible to further surely carry out the growth of the modified layer 5a onto the sidewall of the organic insulating film 5.

Also, the etching of the organic insulating film 5 in which the etching gas containing the nitrogen gas is used, and the irradiation of the nitrogen plasma after the etching of the organic insulating film 5 may be used at the same time. This simultaneous usage is desired in that the modified layer 5a can be grown further surely.

SECOND EMBODIMENT

In the second embodiment, the technique for adding the nitrogen and growing the modified layer on the sidewall of the organic insulating film is applied to a dual damascene process.

Figure 14:
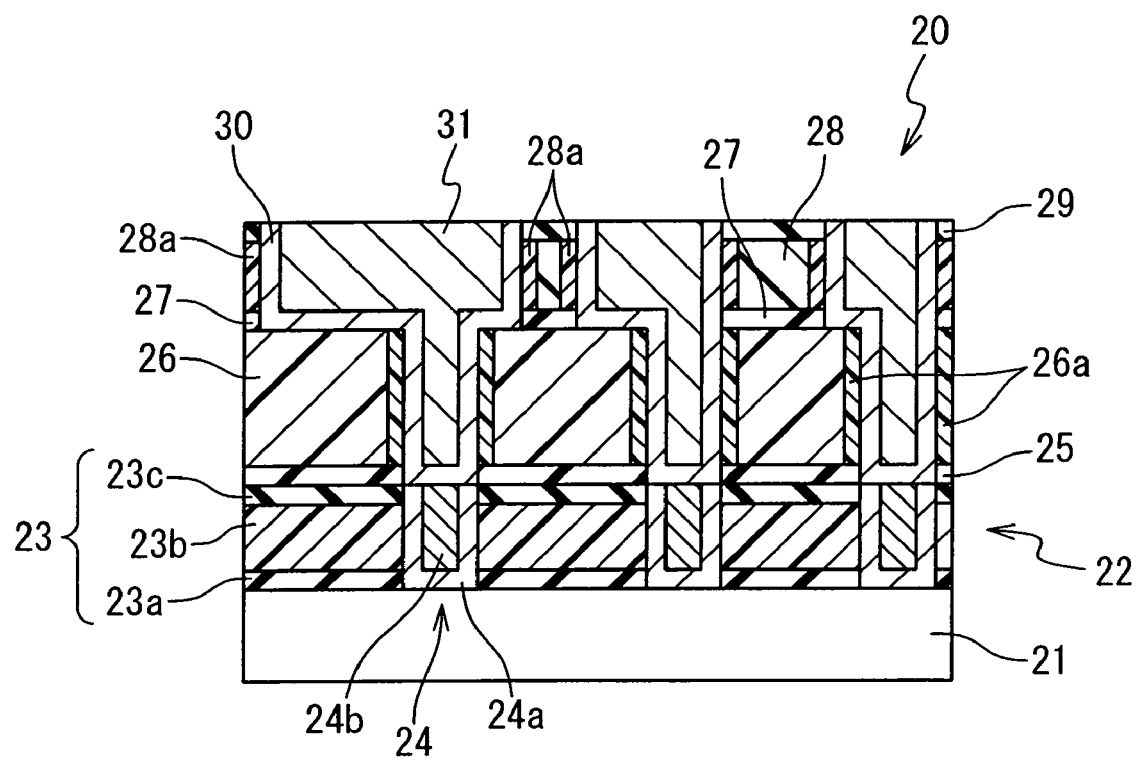
FIG. 14 is a cross sectional view showing the semiconductor device according to a second embodiment of the present invention.

FIG. 14 shows a semiconductor device 20 according to the second embodiment of the present invention. The semiconductor device 20 has a substrate 21 and a lower wiring structure 22 formed on the substrate 21. Although MOS transistors and plugs are formed on the substrate 21, all of them are not shown. The lower wiring structure 22 includes a laminated insulating film 23 and a copper wiring 24. The copper wiring 24 is embedded in a wiring groove formed in the laminated insulating film 23.

On the lower wiring structure 22, a cap film 25 and an organic interlayer film 26 are sequentially formed. The cap film 25 is formed of a silicon nitride film. The organic interlayer film 26 is formed of an organic low dielectric constant material whose dielectric constant is low, and it is typically formed of di-vinyl-siloxane benzo cyclobutene (BCB) polymer. As described later, the cap film 25 is used as an etching stopper of the organic interlayer film 26 formed of the organic low dielectric constant material. via-holes are formed to pass through the cap film 25 and the organic interlayer film 26 to the copper wiring 24.

On the organic interlayer film 26, a stopper film 27, an organic interlayer film 28 and a hard mask film 29 are sequentially formed. The stopper film 27 is formed of a silicon nitride film. The organic interlayer film 28 is formed of an organic low dielectric constant material whose dielectric constant is low, and it is typically formed of the di-vinyl-siloxane benzo cyclobutene (BCB) polymer. The stopper film 27 is used as an etching stopper in etching the organic interlayer film 28 formed of the organic low dielectric constant material. The hard mask film 29 is formed of a silicon nitride film. The hard mask film 29 is used as a hard mask in etching the organic interlayer film 28.

Wiring grooves are formed to pass through the stopper film 27, the organic interlayer film 28 and the hard mask film 29 to the organic interlayer film 26. The wiring groove and the via-hole passing through the cap film 25 and the organic interlayer film 26 are covered with a barrier film 30. The barrier film 30 is composed of a tantalum film (not shown) to cover the wiring groove and the via-hole, a nitride tantalum film (not shown) to cover the tantalum film. On the barrier film 30, a copper film 31 is formed so as to embed the wiring groove and the via-hole. The copper film 31 is formed of copper as a main component. A portion of the copper film 31 embedded constitutes an upper wiring. On the other hand, a portion of the copper film 31 embedded in the via-hole constitutes a via to connect the upper wiring and the copper wiring 24 of the lower wiring structure 22.

On the sidewall of the organic interlayer film 26 constituting the side of the via-hole, a modified layer 26a is formed. On the organic interlayer film 26 constituting the side of the wiring groove, a modified layer 28a is formed. The modified layer 26a and the modified layer 28a are formed while the etching gas containing the nitrogen gas and the $C_4F_8$ is used to etch, similarly to the modified layer 5a in the first embodiment. Thus, the modified layer 26a and the modified layer 28a are formed to contain carbon atoms, nitrogen atoms and fluorine atoms. Many carbon-nitrogen bonds are formed in the modified layer 26a and modified layer 28a, which include the many carbon atoms and nitrogen atoms. The modified layer 26a and modified layer 28a, in which the many carbon-nitrogen bonds are formed, effectively protect the organic interlayer film 26 and the organic interlayer film 28. Moreover, the modified layers 26a, 28a prevent the copper from being diffused from the copper film 31, and reduce leak current in the organic interlayer film 26 and the organic interlayer film 28.

On the other hand, the fluorine concentrations of the modified layer 26a and the modified layer 28a are suppressed so as to be lower than the nitrogen concentration so that the copper film 31 is not corroded.

Figure 15:
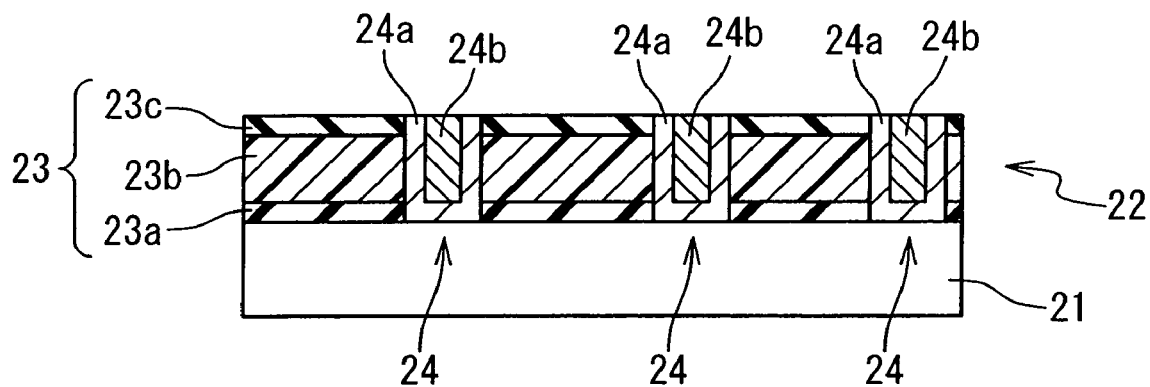
FIG. 15 is a cross sectional view showing a manufacturing method of the semiconductor device in the second embodiment.

FIG. 15 to FIG. 23 show the manufacturing method of the semiconductor device 20 in the second embodiment. The second embodiment uses a so-called [Via First Process]. As shown in FIG. 15, a silicon nitride film 23a, an organic insulating film 23b and a silicon nitride film 23c are sequentially deposited on the substrate 21 to form the laminated insulating film 23. Subsequently, the wiring groove is formed in the laminated insulating film 23. Then, the copper wiring 24 is formed so as to embed the wiring groove. The copper wiring 24 is composed of a barrier film 24a for covering the wiring groove, and a copper film 24b formed on the barrier film 24a. The embedding of the copper wiring 24 is carried out by the known damascene technique to one skilled in the art. When the copper wiring 24 is embedded, the formation of the lower wiring structure 22 is completed.

Figure 16:
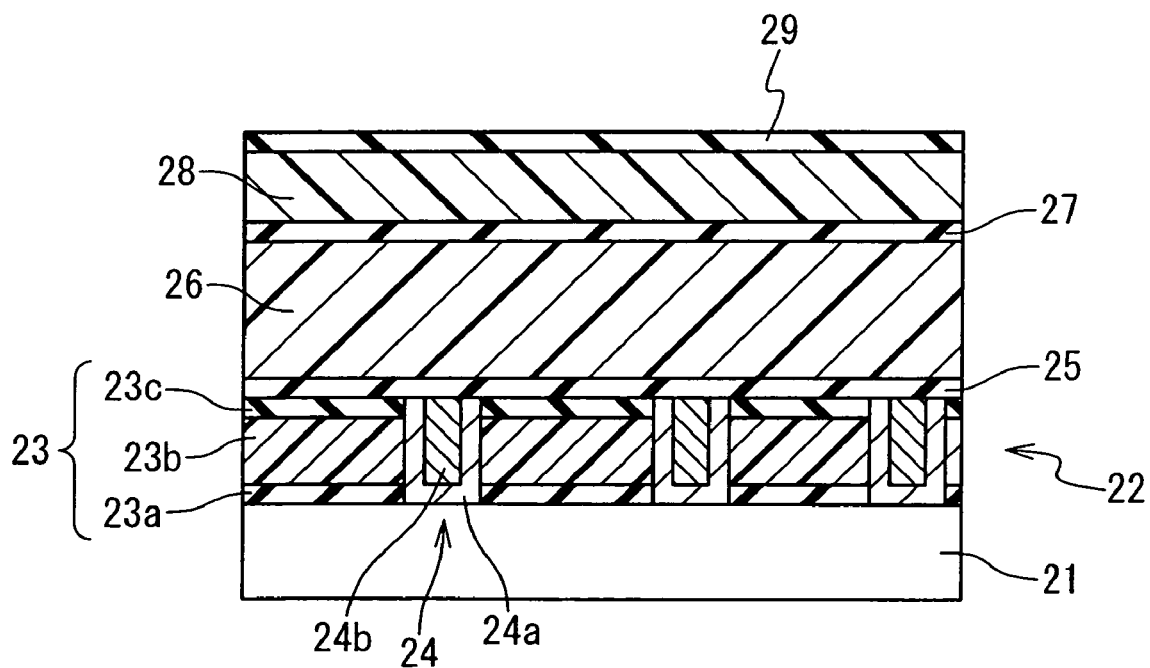
FIG. 16 is a cross sectional view showing the manufacturing method of the semiconductor device in the second embodiment.

After the formation of the lower wiring structure 22, as shown in FIG. 16, the cap film 25, the organic interlayer film 26, the stopper film 27, the organic interlayer film 28 and the hard mask film 29 are sequentially formed. The cap film 25, the stopper film 27 and the hard mask film 29 are formed of the silicon nitride film. The organic interlayer film 26 and the organic interlayer film 28 are formed of the organic low dielectric constant material. Typically, for the organic interlayer film 26, the divinyl-siloxane benzo cyclobutene (BCB) polymer is used.

Figure 17:
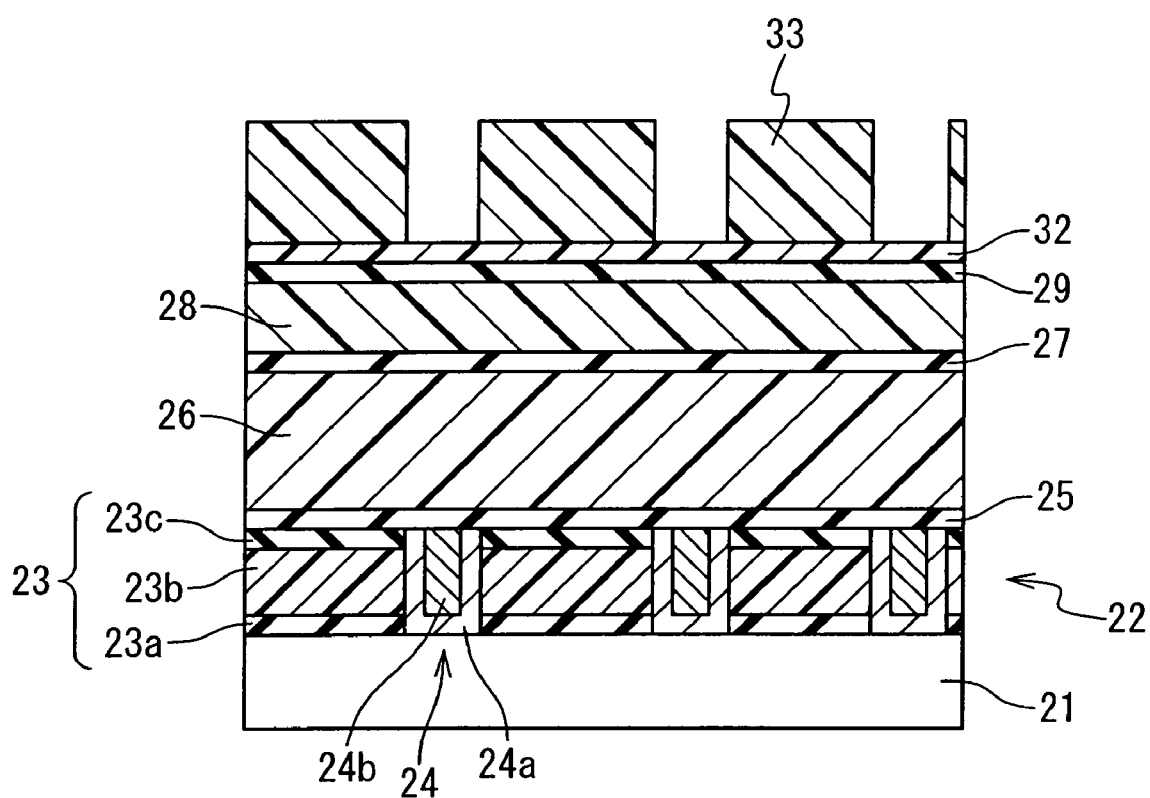
FIG. 17 is a cross sectional view showing the manufacturing method of the semiconductor device in the second embodiment.

Subsequently, as shown in FIG. 17, after a reflection protecting film 32 is formed on the entire surface on the top surface side of the substrate 21, and a photo resist mask 33 is formed on the reflection protecting film 32. The photo resist mask 33 defines the positions of the via-holes penetrating the organic interlayer film 26.

Figure 18:
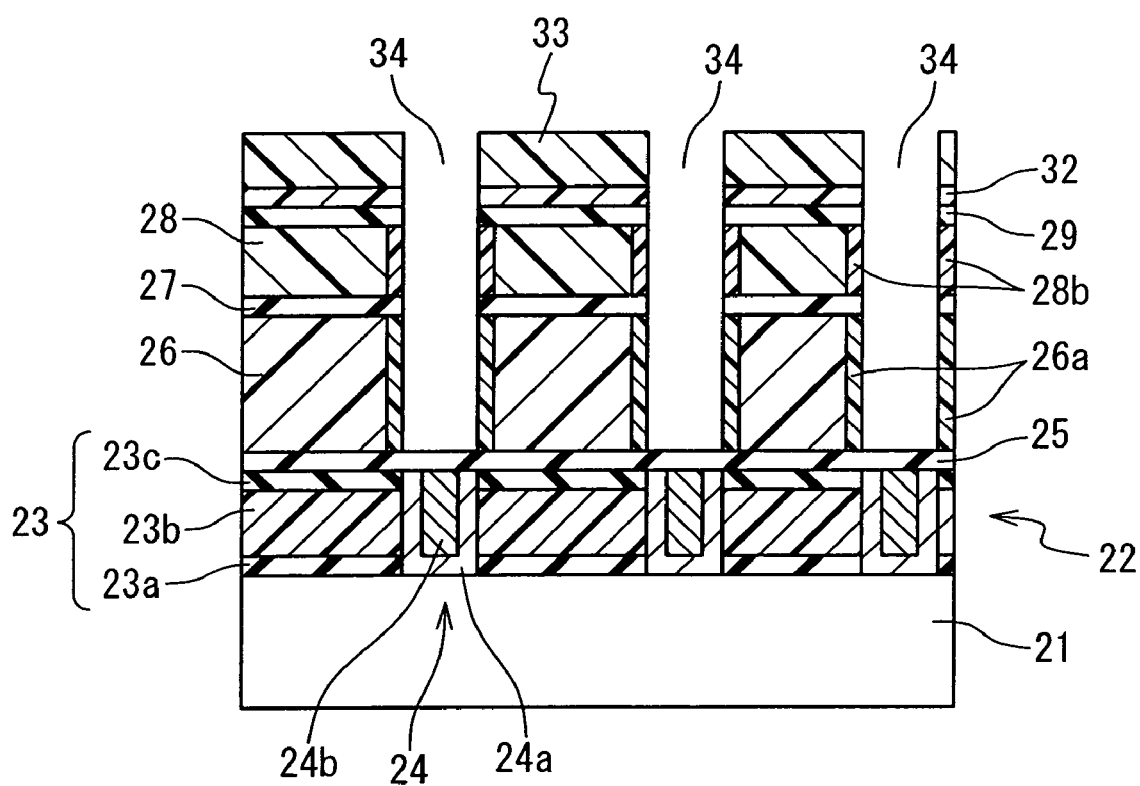
FIG. 18 is a cross sectional view showing the manufacturing method of the semiconductor device in the second embodiment.

After the formation of the photo resist mask 33, as shown in FIG. 18, the photo resist mask 33 is used to sequentially etch the reflection protecting film 32, the hard mask film 29, the organic interlayer film 28, the stopper film 27 and the organic interlayer film 26. Thus, a via-hole 34 reaching the cap film 25 is formed.

In etching the organic interlayer film 26 and the organic interlayer film 28, the etching gas in which the $C_4F_8$, the nitrogen gas ($N_2$) and the oxygen gas ($O_2$) are mixed is used. The main component of the etching gas is the nitrogen gas. Since the organic interlayer film 26 and the organic interlayer film 28 are etched by the etching gas whose main component is the nitrogen gas, and nitrogen radicals contained in plasma is implanted into the organic interlayer film 26 and the organic interlayer film 28. Through the implantation of the nitrogen radicals, the modified layers 26a, 28b including many carbon atoms and nitrogen atoms are formed in the organic interlayer film 26 and the organic interlayer film 28, respectively. The many carbon-nitrogen bonds are formed in the modified layers 26a, 28b, which effectively protect the organic interlayer film 26 and the organic interlayer film 28, in a semiconductor manufacturing process which will be done below. The fluorine concentrations of the modified layers 26a, 28b are low to a degree that the copper film 31 is not corroded, and lower than the nitrogen concentration. However, in the modified layer 28b formed in the organic interlayer film 28, the portion inside the wiring groove where the barrier film 30 and the copper film 31 are embedded is removed in the following process.

Similarly to the first embodiment, the etching attachments containing the many fluorine atoms are deposited on the sidewalls of the hard mask film 29, the organic interlayer film 28, the stopper film 27 and the organic interlayer film 26. However, they are not shown in FIG. 18.

Figure 19:
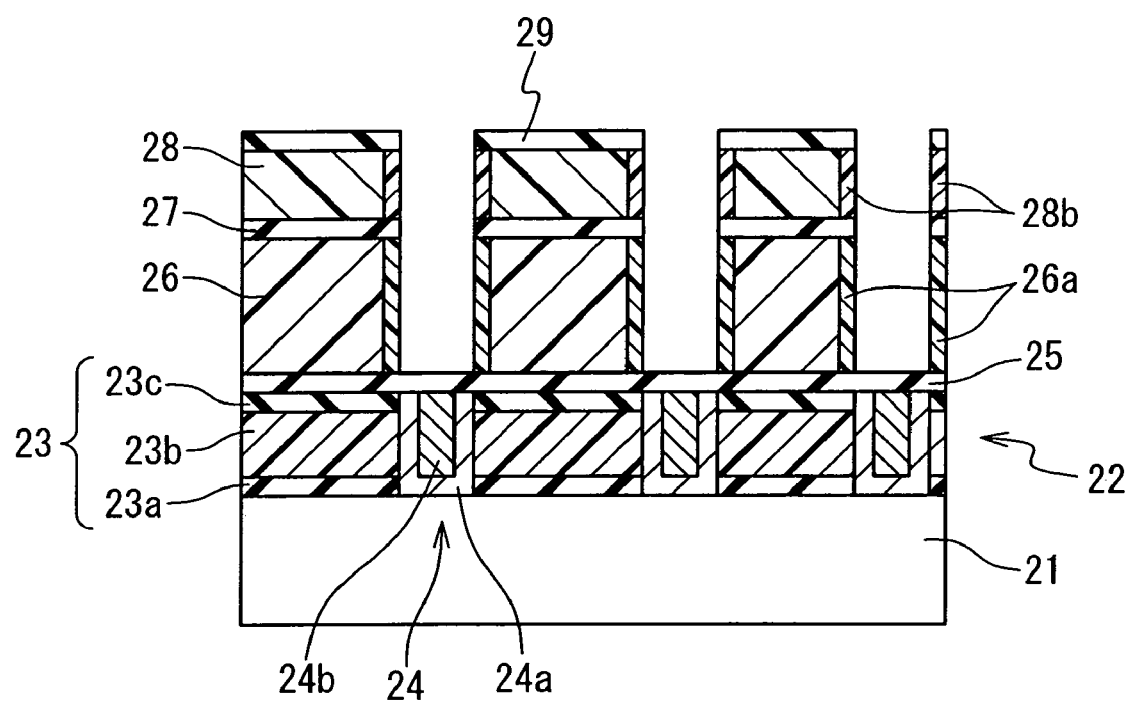
FIG. 19 is a cross sectional view showing the manufacturing method of the semiconductor device in the second embodiment.

Subsequently, as shown in FIG. 19, the reflection protecting film 32 and the photo resist mask 33 are removed by the organically rinsing step. Even the etching attachments are removed by the organically rinsing step at the same time.

Figure 20:
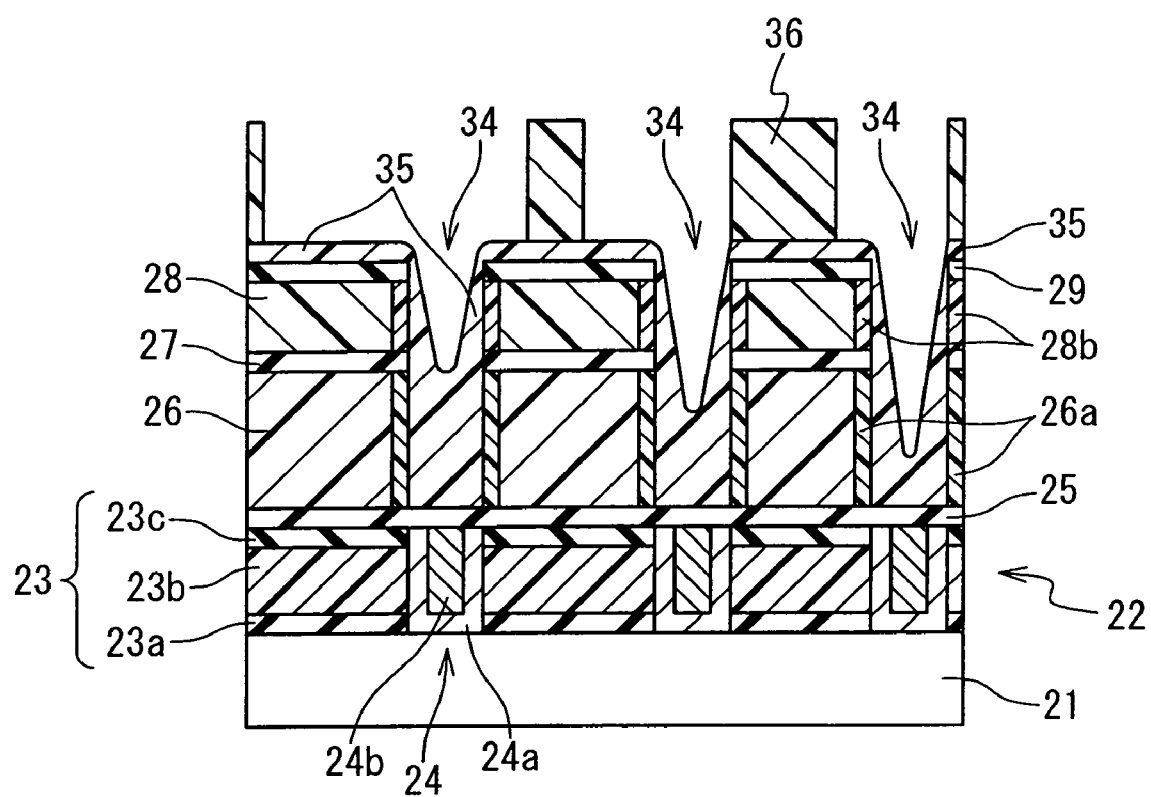
FIG. 20 is a cross sectional view showing the manufacturing method of the semiconductor device in the second embodiment.

Subsequently, after a reflection protecting film 35 is formed on the entire surface on the top surface side of the substrate 21, as shown in FIG. 20, a photo resist mask 36 is formed by a photolithography technique. The reflection protecting film 35 is thickly formed in the via-hole 34, and the reflection protecting film 35 protects the cap film 25 located in the bottom portion of the via-hole 34. The photo resist mask 36 defines the positions of the wiring grooves formed in the hard mask film 29 and the organic interlayer film 28.

Figure 21:
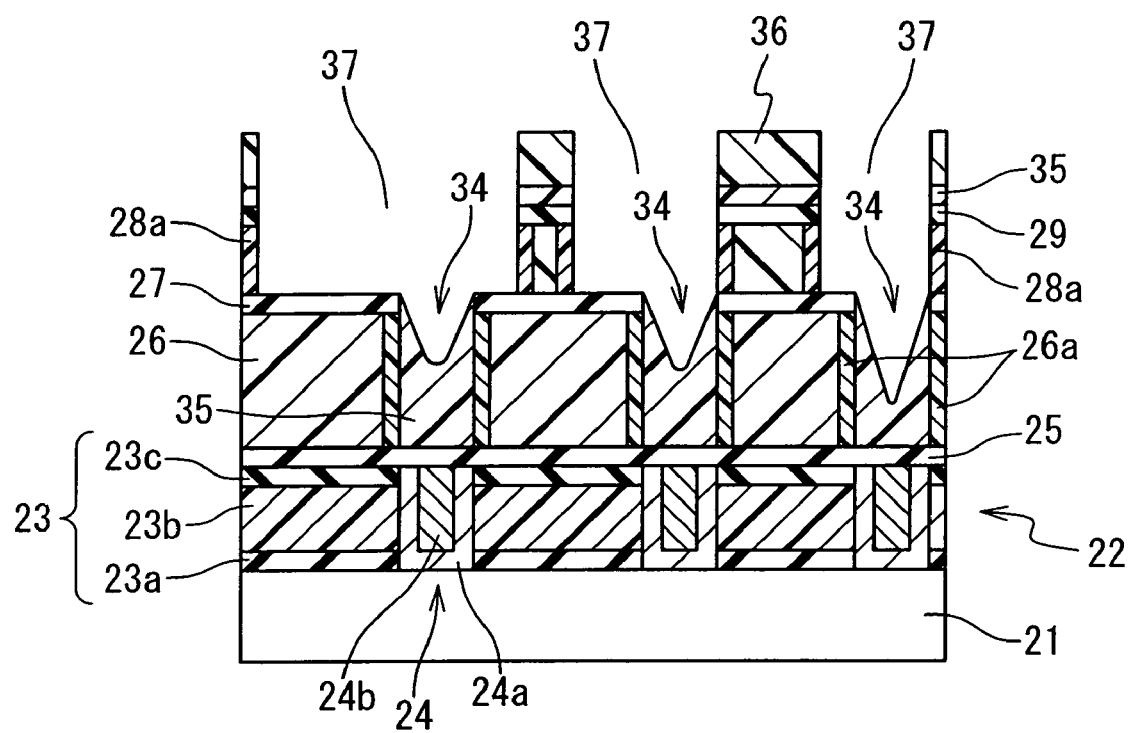
FIG. 21 is a cross sectional view showing the manufacturing method of the semiconductor device in the second embodiment.

Subsequently, as shown in FIG. 21, the photo resist mask 36 is used to etch the reflection protecting film 35, the organic interlayer film 28 and the hard mask film 29. Thus, a wiring groove 37 is formed.

In etching the organic interlayer film 28, the etching gas is used in which the $C_4F_8$, the nitrogen gas ($N_2$) and the oxygen gas ($O_2$) are mixed, similarly to the etching of the organic interlayer film 26 as mentioned above. The main component of the etching gas is the nitrogen gas. Due to the usage of the etching gas having such composition, the modified layer 28a including the many carbon atoms and nitrogen atoms is formed on the sidewall of the organic interlayer film 28. The modified layer 28a effectively protects the organic interlayer film 28, in the following semiconductor manufacturing process. The fluorine concentration of the modified layers 28a is low to a degree that the copper film 31 is not corroded, and lower than the nitrogen concentration.

When the wiring groove 37 and the via-hole 34 are partially matched in position, the modified layer 28b is already formed on the sidewall facing the wiring groove 37 of the organic interlayer film 28. In this case, the modified layer 28b constitutes a part of the modified layer 28a.

Etching the organic interlayer film 28 causes the etching attachments containing the many fluorine atoms to be deposited on the sidewall of the organic interlayer film 28. However, the etching attachments are not shown in FIG. 21.

Figure 22:
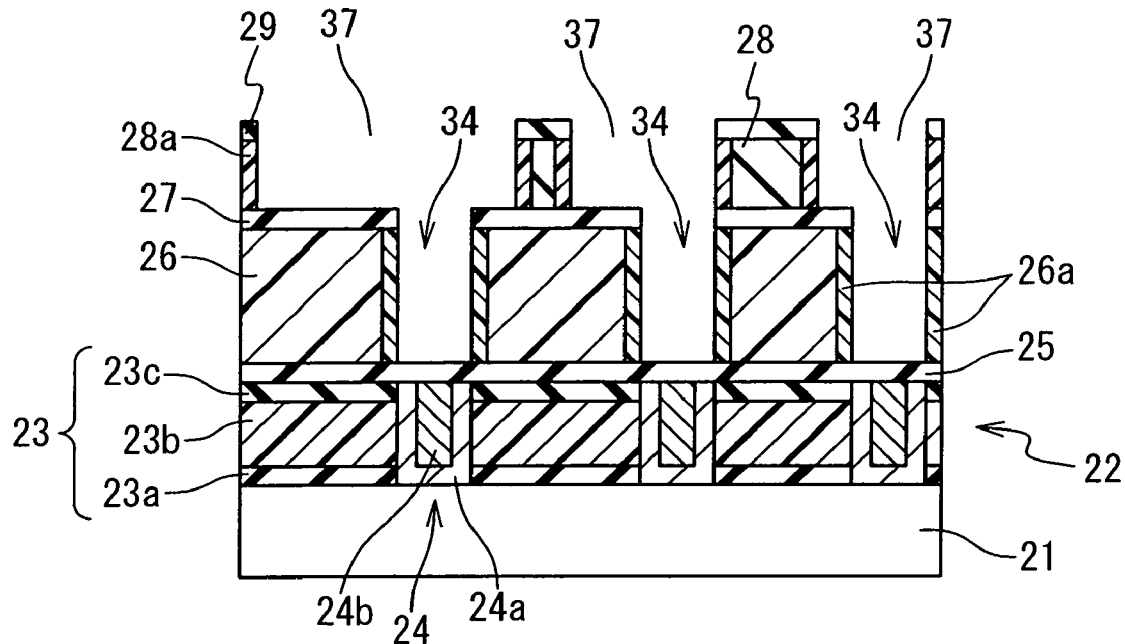
FIG. 22 is a cross sectional view showing the manufacturing method of the semiconductor device of the second embodiment.

Subsequently, as shown in FIG. 22, the reflection protecting film 35 and the photo resist mask 36 are removed by the organically rinsing step. Even the etching attachments are removed by the organically rinsing step, at the same time. The modified layer 26a and the modified layer 28a protect the organic interlayer film 26 and the organic interlayer film 28, respectively, at this organically rinsing step.

Figure 23:
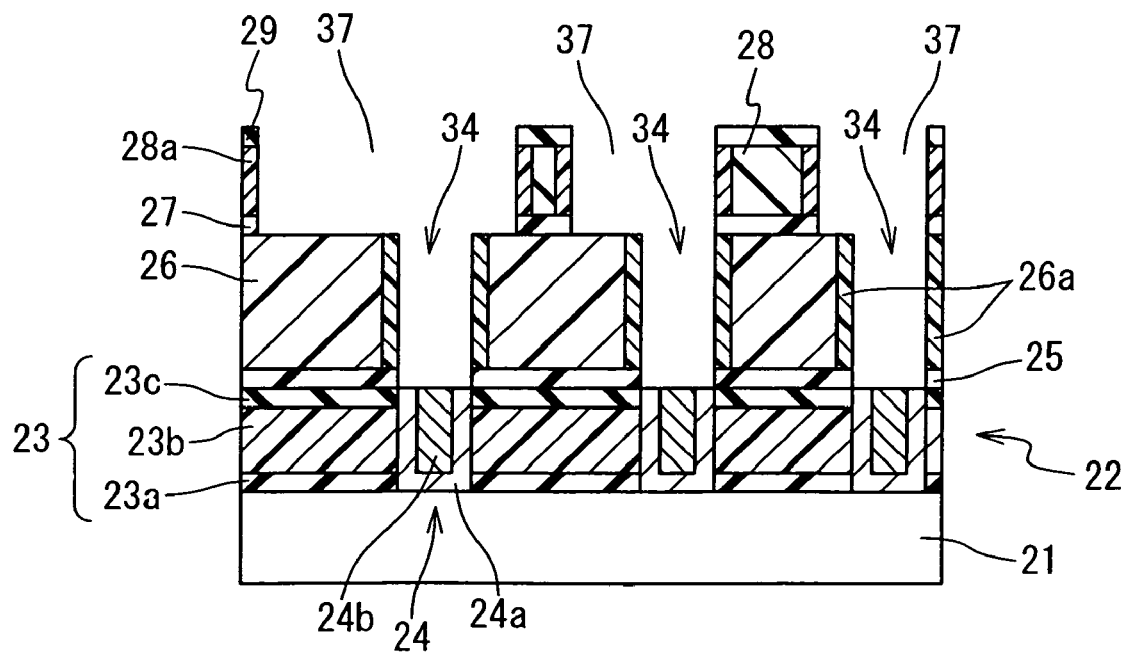
FIG. 23 is a cross sectional view showing the manufacturing method of the semiconductor device in the second embodiment.

Moreover, as shown in FIG. 23, the portions exposed in the cap film 25 and stopper film 27 are removed by the etch-back, and the via-hole 34 reaches the copper wiring 24. The modified layer 26a and the modified layer 28a protect the organic interlayer film 26 and the organic interlayer film 28, respectively, at the time of this etch-back.

Subsequently, after the barrier films 30 are formed on the side and bottom surfaces of the wiring groove 37 and the via-hole 34, the copper film 31 is formed, and the via-hole 34 and the wiring groove 37 are embedded. When the copper film 31 is formed, the formation of the semiconductor device 20 shown in FIG. 14 is ended.

As described above, in the second embodiment, the modified layers 26a, 28a to which the nitrogen is added are formed on the sidewalls of the organic interlayer film 26 and the organic interlayer film 28. The modified layers 26a, 28a have the structures that are mechanically chemically strong, and prevent the organic interlayer film 26 and the organic interlayer film 28 from the damage applied in the semiconductor process. Moreover, the modified layers 26a, 28a prevent the copper from being diffused from the copper wiring 31, and reduce leak currents flowing through the organic interlayer film 26 and the organic interlayer film 28.

Figure 24:
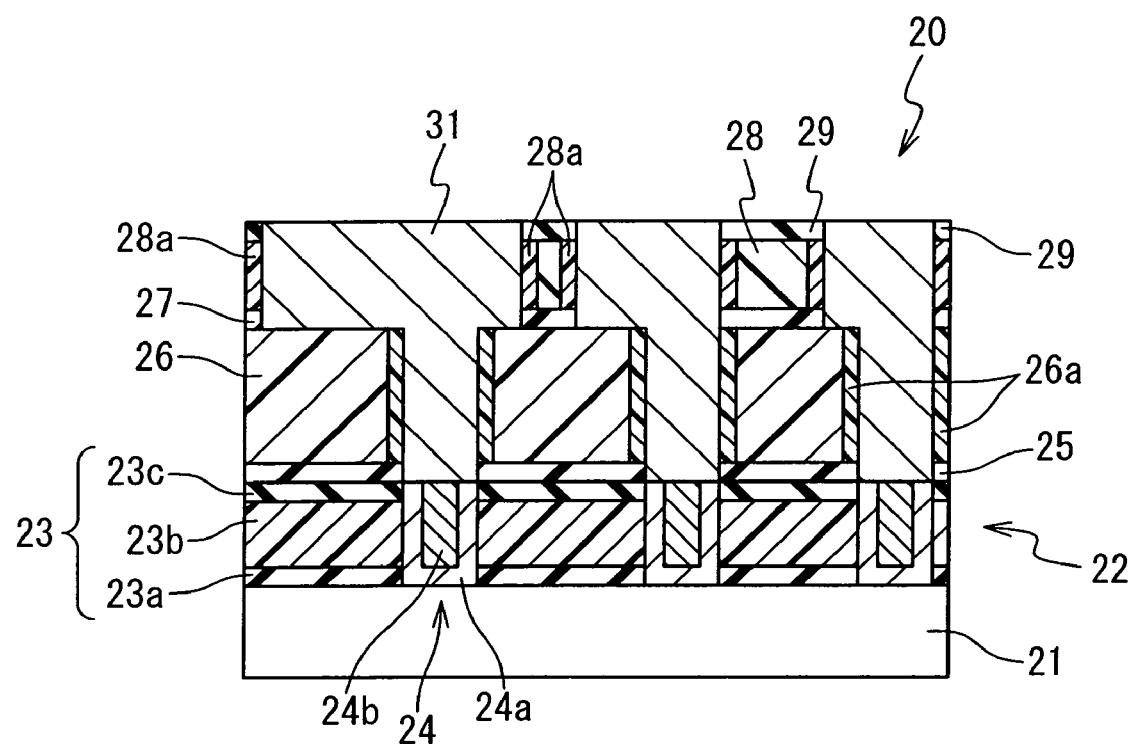
FIG. 24 is a cross sectional view showing a modification of the semiconductor device of the second embodiment.

In the second embodiment, as shown in FIG. 24, the barrier film 30 may be removed from the semiconductor device 20. In this case, the copper film 31 is in direct contact with the modified layer 26a and the modified layer 28a. However, since the modified layer 26a and the modified layer 28a effectively function as the barrier film against the copper included in the copper film 31, the fact that the barrier film 30 does not exist does not have a large influence on the operation of the semiconductor device 20. The fact that the barrier film 30 is not formed is desired from the viewpoint of the reduction in the number of the steps and the reduction in the cost.

By the way, in the second embodiment, similarly to the first embodiment, in etching the organic interlayer film 26 and the organic interlayer film 28, it is possible to intermittently execute the discharging to induce the plasma for the etching. The intermittent discharging promotes the growths of the modified layers 26a, 28a onto the sidewalls of the organic interlayer film 26 and the organic interlayer film 28.

Also, in etching the organic interlayer film 26 and the organic interlayer film 28, it is possible to intermittently apply the bias to the substrate 21. The intermittent bias application promotes the growths of the modified layers 26a, 28a onto the sidewalls of the organic interlayer film 26 and the organic interlayer film 28.

Moreover, the growths of the modified layers 26a, 28a may be executed by irradiating the nitrogen plasma to the organic interlayer film 26 and the organic interlayer film 28, after etching the organic interlayer film 26 and the organic interlayer film 28. The growths of the modified layers 26a, 28a through the irradiation of the nitrogen plasma are desired in that the modified layers 26a, 28a can be surely formed.

THIRD EMBODIMENT

In the third embodiment, the semiconductor device 20 of the second embodiment is formed by a so-called [Dual Hard Mask Process] and not by the [Via First Process].

At first, similarly to the second embodiment, after the lower wiring structure 22 shown in FIG. 15 is formed on the substrate 21, as shown in FIG. 16, the cap film 25, the organic interlayer film 26, the stopper film 27, the organic interlayer film 28 and the hard mask film 29 are formed. As mentioned above, the cap film 25, the stopper film 27 and the hard mask film 29 are formed of the silicon nitride film, and the organic interlayer film 26 and the organic interlayer film 28 are formed of the organic low dielectric constant material.

As described later, in the third embodiment, the organic interlayer film 26 and the organic interlayer film 28 require the usage of the material which enables the selective etching to the photo resist and the reflection protecting film. Typically, for the organic interlayer film 26, the divinyl-siloxane benzo cyclobutene (BCB) polymer is used.

Figure 25:
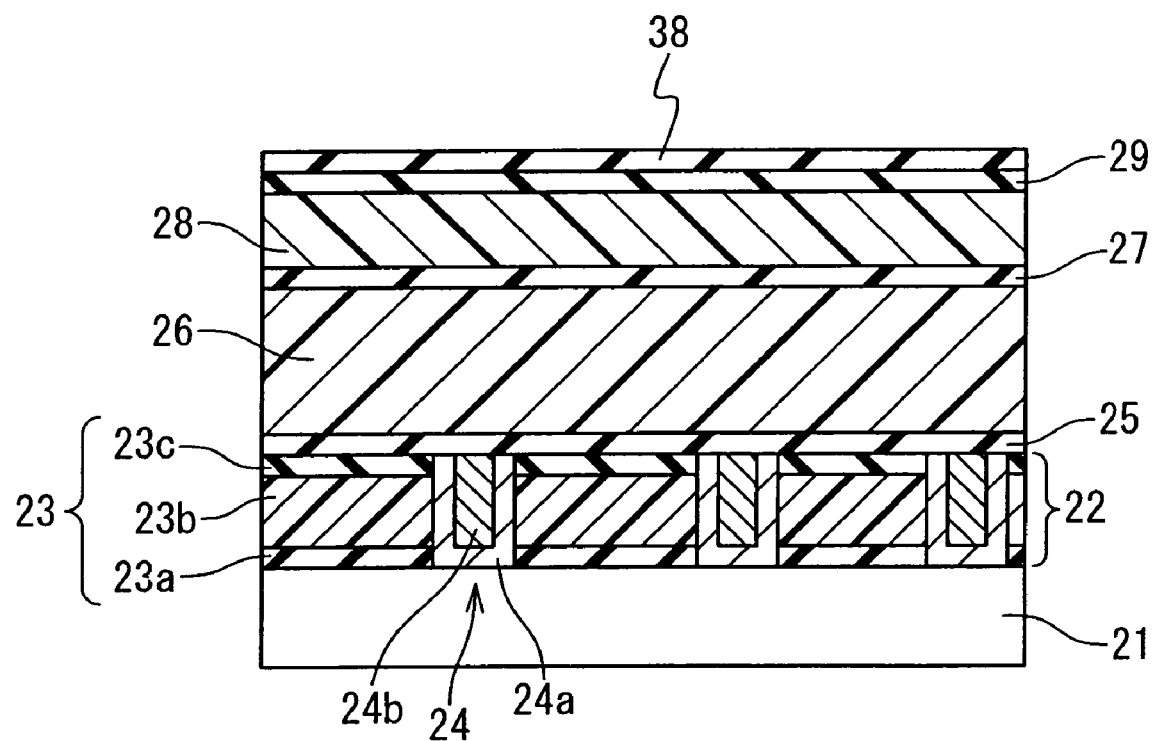
FIG. 25 is a cross sectional view showing a manufacturing method of a semiconductor device according to a third embodiment of the present invention.

In the third embodiment, as shown in FIG. 25, a sacrificial hard mask film 38 is further formed on the hard mask film 29. The sacrificial hard mask film 38 is made of silicon oxide film. As described later, the sacrificial hard mask film 38 is finally removed from the semiconductor device 20.

Figure 26:
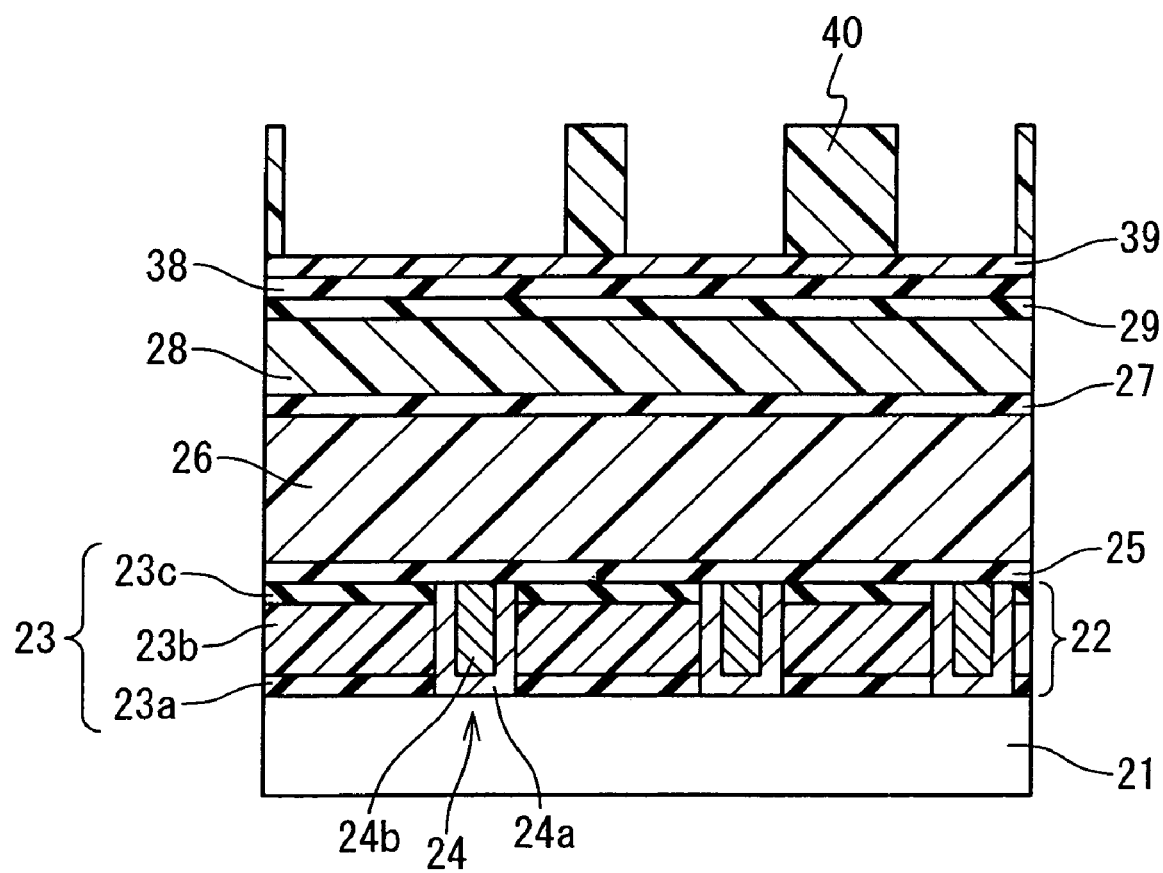
FIG. 26 is a cross sectional view showing the manufacturing method of the semiconductor device in the third embodiment.

Subsequently, after a reflection protecting film 39 is formed on the entire surface of the top surface side of the substrate 21, as shown in FIG. 26, the photolithography technique is used to form a photo resist mask 40 on the reflection protecting film 39. The photo resist mask 40 defines the positions of the wiring grooves that are formed in the organic interlayer film 28 and the hard mask film 29.

Figure 27:
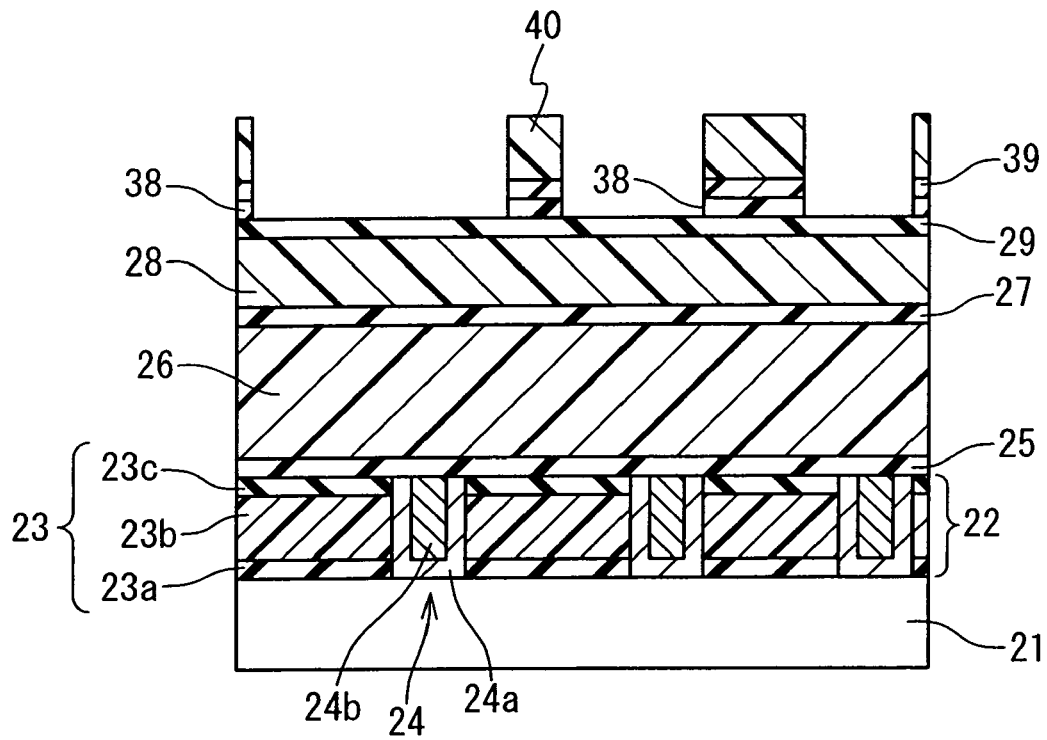
FIG. 27 is a cross sectional view showing the manufacturing method of the semiconductor device in the third embodiment.

After the formation of the photo resist mask 40, as shown in FIG. 27, the photo resist mask 40 is used to etch the sacrificial hard mask film 38. The etching of the sacrificial hard mask film 38 formed of the silicon oxide film is carried out under the condition that the selection ratio between the silicon oxide film and the silicon nitride film is high, and the hard mask film 29 made of the silicon nitride film is not substantially etched. Since the sacrificial hard mask film 38 is etched, the pattern of the wiring groove defined by the photo resist mask 40 is transferred to the sacrificial hard mask film 38.

Figure 28:
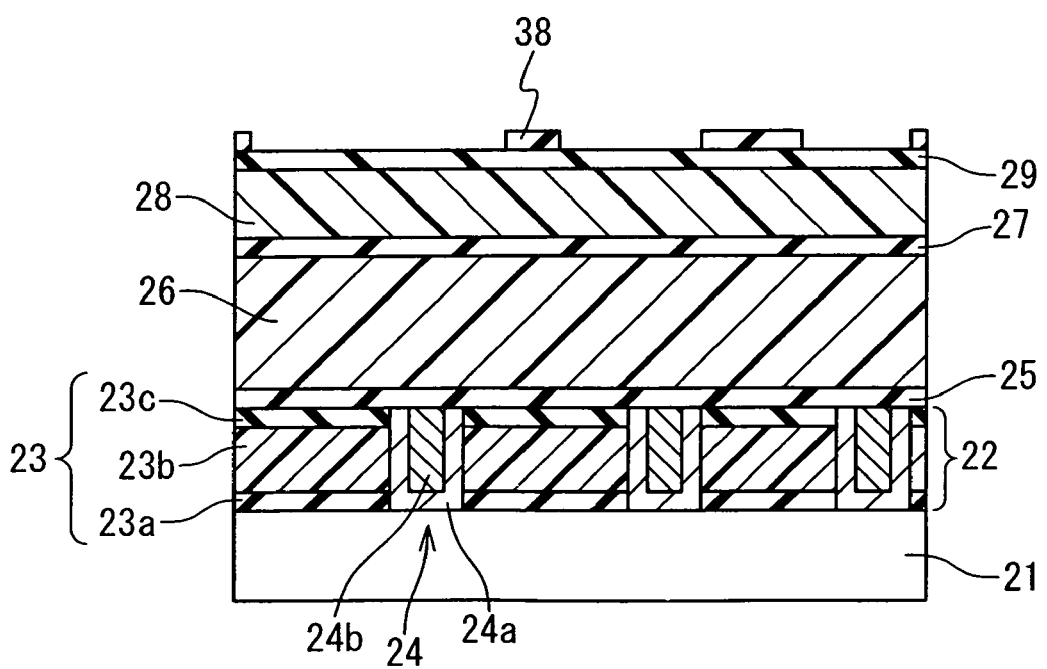
FIG. 28 is a cross sectional view showing the manufacturing method of the semiconductor device in the third embodiment.

After the etching of the sacrificial hard mask film 38, as shown in FIG. 28, the reflection protecting film 39 and the photo resist mask 40 are removed by the ashing in which the oxygen plasma is used.

Figure 29:
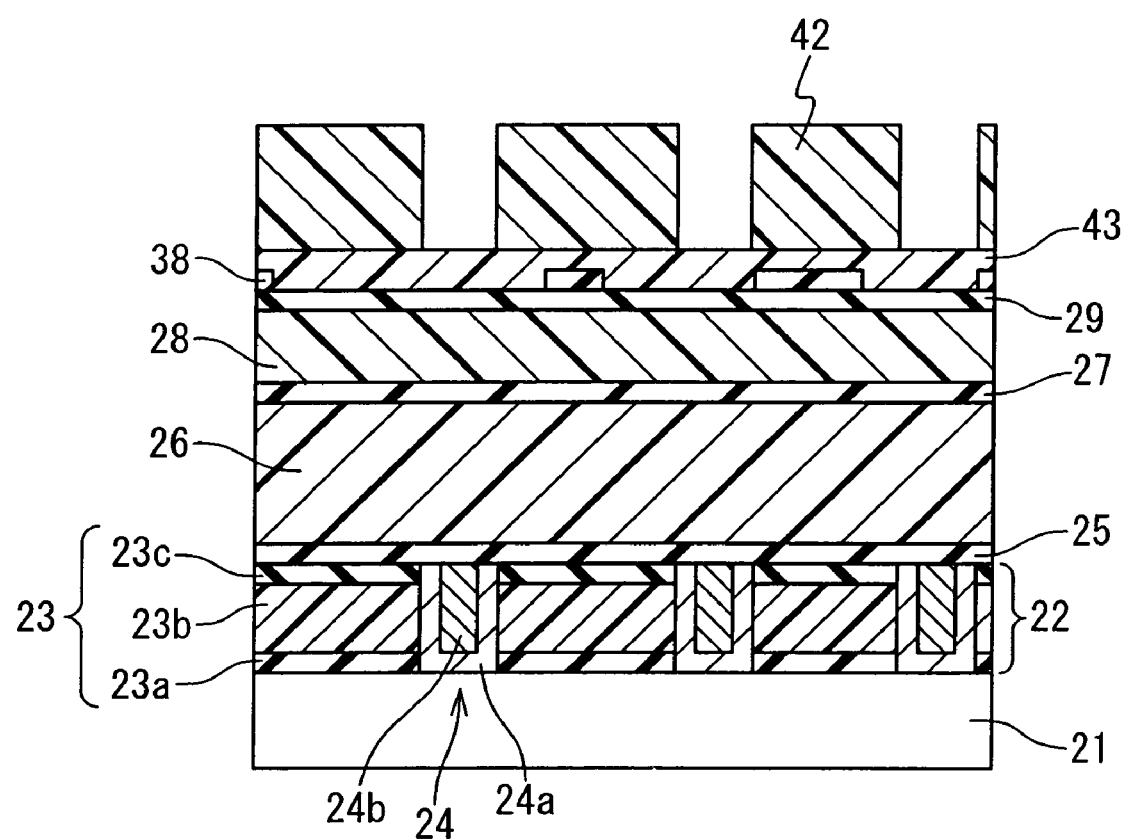
FIG. 29 is a cross sectional view showing the manufacturing method of the semiconductor device in the third embodiment.

Subsequently, after a reflection protecting film 41 is formed on the entire surface of the top surface side of the substrate 21, as shown in FIG. 29, a photo resist mask 42 is formed on the reflection protecting film 41. The photo resist mask 42 defines the positions of the via-holes formed to pass through the cap film 25 and the organic interlayer film 26.

Figure 30:
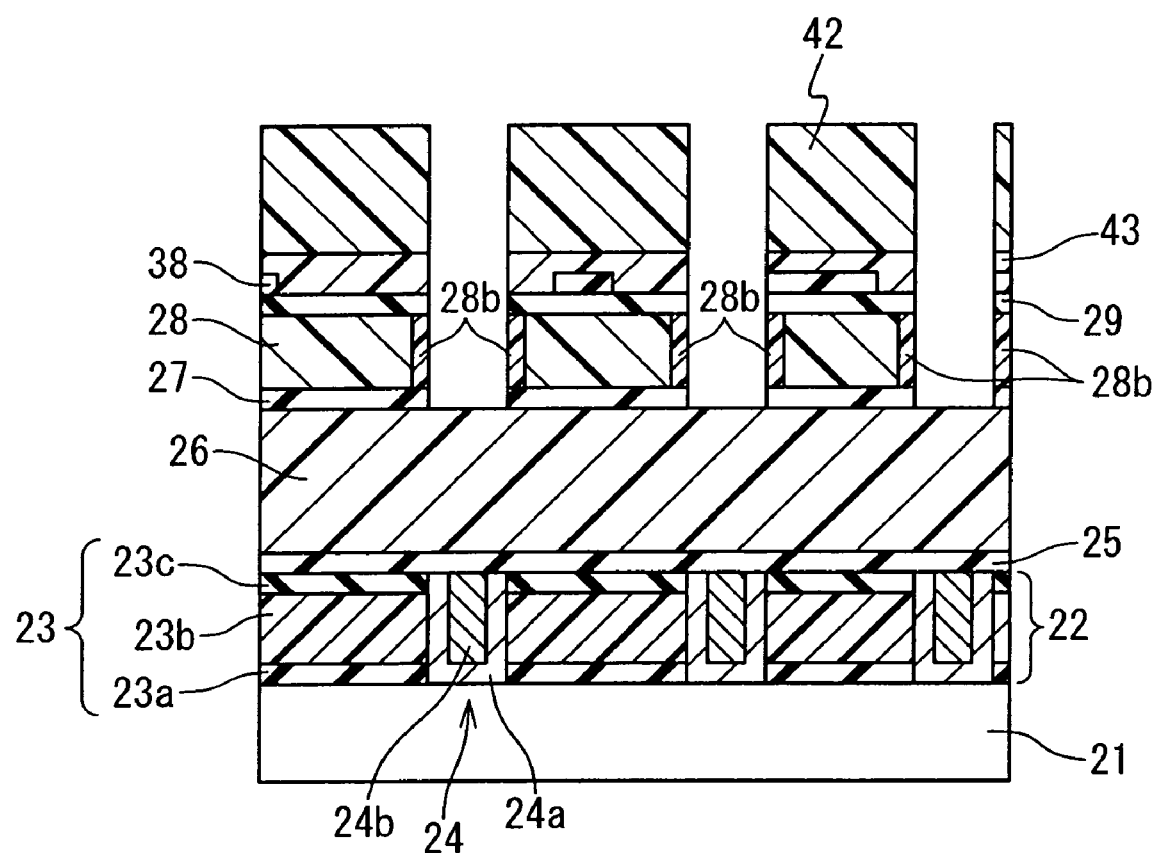
FIG. 30 is a cross sectional view showing the manufacturing method of the semiconductor device in the third embodiment.

After the formation of the photo resist mask 42, as shown in FIG. 30, the photo resist mask 42 is used to sequentially etch the reflection protecting film 41, the hard mask film 29, the organic interlayer film 28 and the stopper film 27. This etching causes the pattern of the via-hole defined by the photo resist mask 42 to be transferred to the hard mask film 29. When the stopper film 27 is etched to expose the organic interlayer film 26, a part of the organic interlayer film 26 can be etched. However, the fact that the organic interlayer film 26 is etched does not bring about any special problem.

In etching the organic interlayer film 28, the etching gas is used in which the $C_4F_8$, the nitrogen gas ($N_2$) and the oxygen gas ($O_2$) are mixed. The main component of the etching gas is the nitrogen gas. Since the etching gas having such composition is used, the modified layer 28b containing the many carbon atoms and nitrogen atoms is formed on the sidewall of the organic interlayer film 28. The modified layer 28b effectively protects the organic interlayer film 28, in the process which will be executed below. The fluorine concentration of the modified layer 28b is low to a degree that the copper film 31 is not corroded, and lower than the nitrogen concentration. However, in the modified layer 28b formed in the organic interlayer film 28, a portion of the modified layer 28b inside the wiring groove where the barrier film 30 and the copper film 31 are embedded is removed in the following process.

Although an etching attachments including a large quantity of fluorine are deposited on the sidewalls of the hard mask film 29, organic interlayer film 28 and hard mask film 29, they are not shown in FIG. 30.

Figure 31:
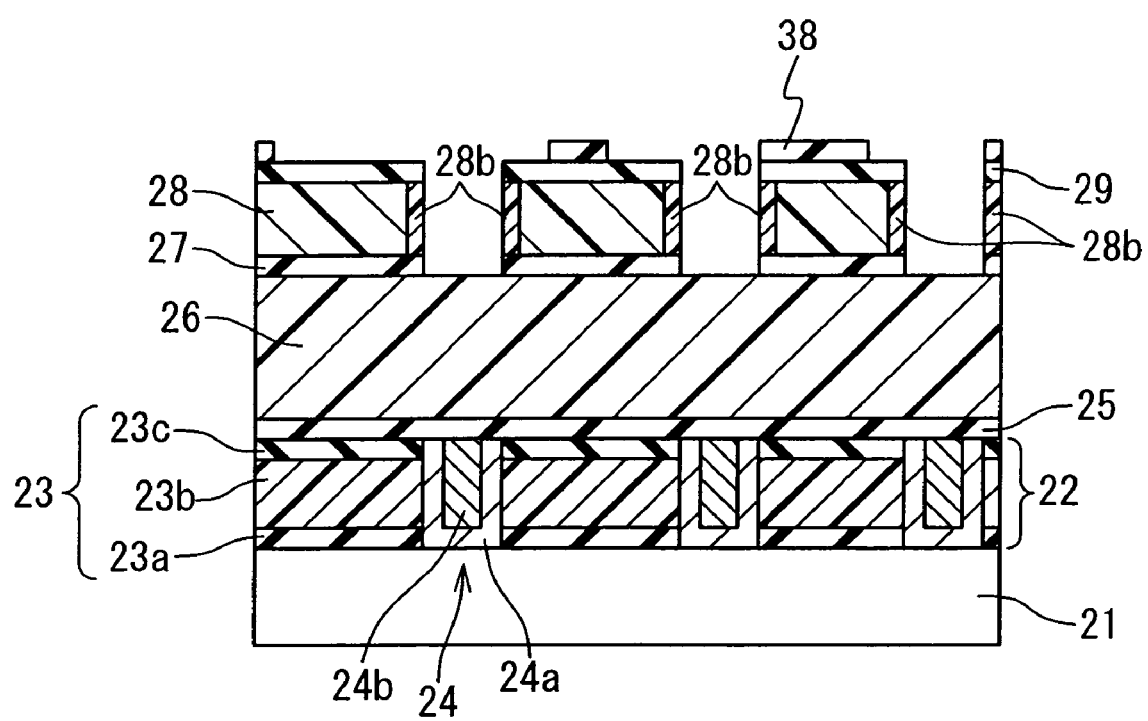
FIG. 31 is a cross sectional view showing the manufacturing method of the semiconductor device in the second embodiment.

Subsequently, as shown in FIG. 31, the reflection protecting film 41 and the photo resist mask 42 are removed by nitrogen/hydrogen plasma. The organic interlayer film 26 and organic interlayer film 28 which are formed of the BCB polymer have the resistance against the nitrogen/hydrogen plasma. Thus, they are not etched when the reflection protecting film 41 and the photo resist mask 42 are removed by the nitrogen/hydrogen plasma.

The removal of the reflection protecting film 41 and the photo resist mask 42 through the nitrogen/hydrogen plasma further nitrides the sidewall of the organic interlayer film 28. This nitriding action further grows the modified layer 28b.

Subsequently, the organically rinsing step is carried out to remove the etching attachments deposited on the sidewalls of the hard mask film 29, the organic interlayer film 28 and the stopper film 27. At the time of this organically rinsing step, the modified layer 28b effectively protects the organic interlayer film 28.

Figure 32:
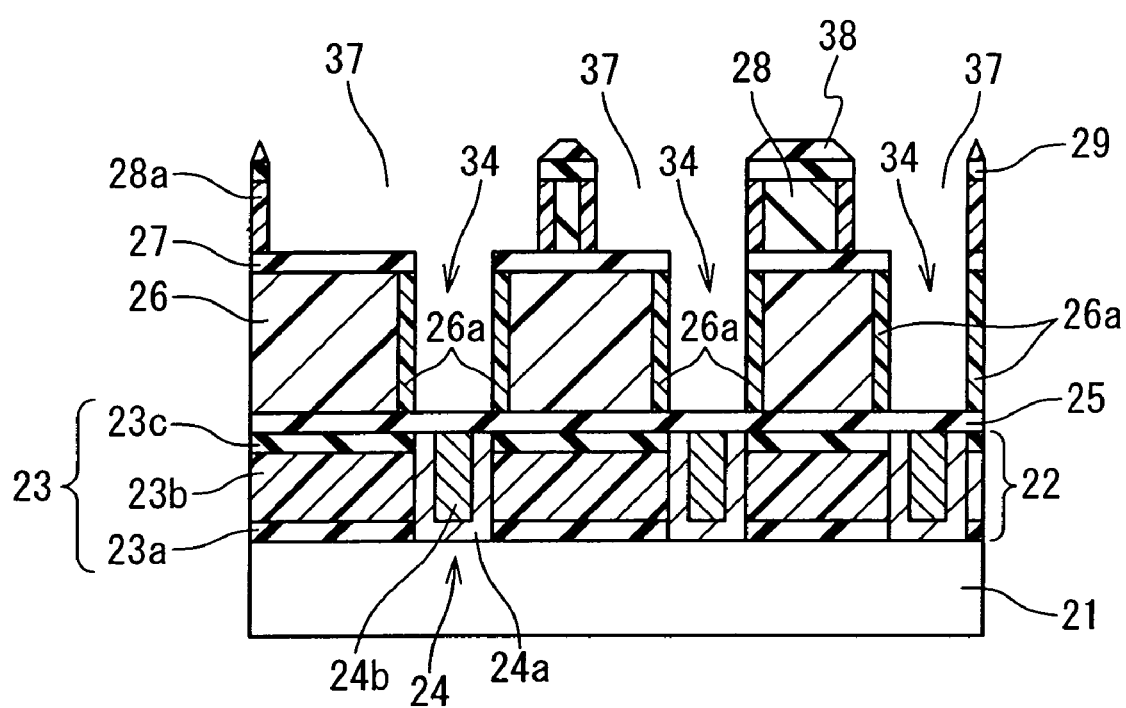
FIG. 32 is a cross sectional view showing the manufacturing method of the semiconductor device in the second embodiment.

After the removal of the reflection protecting film 41 and the photo resist mask 42, as shown in FIG. 32, the sacrificial hard mask 38 is used to etch the hard mask film 29, the organic interlayer film 28 and the organic interlayer film 26. At this etching, in the stage that the etching of the hard mask film 29 is ended, the etching condition is switched to the condition that the selection ratio between the organic interlayer film 28 and the stopper film 27 and the selection ratio between the organic interlayer film 26 and the cap film 25 become greater. Then, the stopper film 27 and the cap film 25 are not etched, and they are left. In the modified layer 28b formed in the organic interlayer film 28, a portion of the modified layer 28b which is not partially matched in position with the via-hole penetrating the organic interlayer film 26 is removed by this etching.

In this etching, the etching gas is used in which the $C_4F_8$, the nitrogen gas ($N_2$) and the oxygen gas ($O_2$) are mixed. The main component of the etching gas is the nitrogen gas. Since the etching gas having such composition is used, the modified layers 26a, 28a containing many carbon atoms and nitrogen atoms are formed on the sidewalls of the organic interlayer film 26 and the organic interlayer film 28, respectively. The modified layers 26a, 28a effectively protect the organic interlayer film 26 and the organic interlayer film 28, in the process which will be executed below. The fluorine concentrations of the modified layers 26a, 28a are suppressed low so that the copper film 31 is not corroded, and they are lower than the nitrogen concentration.

Figure 33:
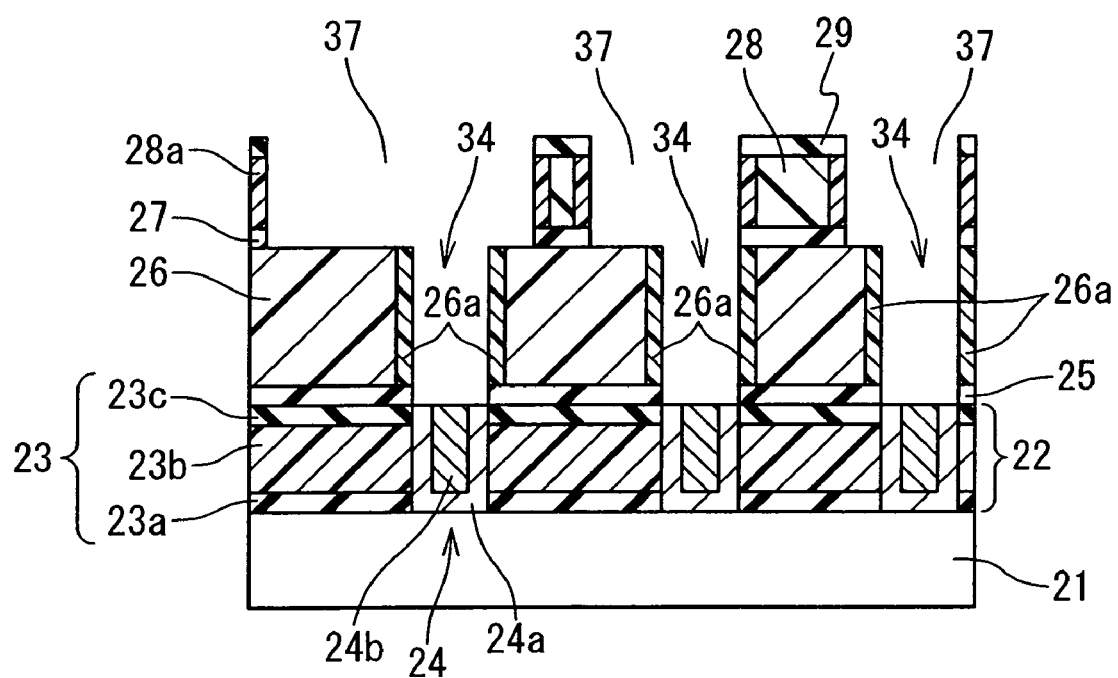
FIG. 33 is a cross sectional view showing the manufacturing method of the semiconductor device in the second embodiment.

Subsequently, as shown in FIG. 33, portions of the cap film 25 and stopper film 27 to be exposed are removed by the etch-back. Due to this etch-back, the via-hole 34 reaches the copper wiring 24. Due to this etch-back, the sacrificial hard mask 38 is removed at the same time.

Subsequently, after the barrier films 30 are formed on the side and bottom surfaces of the wiring groove 37 and the via-hole 34, the copper film 31 is formed, and the via-hole 34 and the wiring groove 37 are embedded. When the copper film 31 is formed, the formation of the semiconductor device 20 shown in FIG. 14 is completed.

In this way, the formation of the semiconductor device 20 shown in FIG. 4 can be executed even by the dual mask process in the third embodiment. However, the formation of the semiconductor device 20 by the dual mask process in the third embodiment is desired over the formation of the semiconductor device 20 by the via first process in the second embodiment, because the damage given to the modified layer 26a is little.

As shown in FIG. 20, in the second embodiment, the reflection protecting film 35 is formed inside the via-hole formed in the organic interlayer film 26, and the reflection protecting film 35 is further removed. When the reflection protecting film 35 is removed, the damage is given to the modified layer 26a formed on the sidewall of the organic interlayer film 26. This damage, since having the possibility that the effect of protecting the organic interlayer film 26 weakens, is not preferable.

On the other hand, in the third embodiment, following the formation of the modified layer 26a onto the sidewall of the organic interlayer film 26, the formations of the barrier film 30 and the copper film 31 are carried out. Thus, in the third embodiment, the damage given to the modified layer 26a is little. The fact that the damage of the modified layer 26a is little is preferable in that the effect of prevention of diffusion of the copper from the copper film 31 becomes high.

By the way, in the third embodiment, similarly to the first embodiment, while the organic interlayer film 26 and the organic interlayer film 28 are etched, it is possible to intermittently carry out the discharging to induce the plasma. Consequently, the growths of the modified layers 26a, 28a onto the sidewalls of the organic interlayer film 26 and the organic interlayer film 28 are promoted.

Also, while the organic interlayer film 26 and the organic interlayer film 28 are etched, it is possible to intermittently apply the bias to the substrate 21. Consequently, the growths of the modified layers 26a, 28a onto the sidewalls of the organic interlayer film 26 and the organic interlayer film 28 are promoted.

Moreover, the growths of the modified layers 26a, 28a may be executed by irradiating the nitrogen plasma to the organic interlayer film 26 and the organic interlayer film 28, after etching the organic interlayer film 26 and the organic interlayer film 28. The growths of the modified layers 26a, 28a through the irradiation of the nitrogen plasma are desired in that the modified layers 26a, 28a can be surely formed.

Also, in the third embodiment, similarly to the second embodiment, the barrier film 30 may be removed from the semiconductor device 20, and the semiconductor device shown in FIG. 24 may be formed. The fact that the barrier film 30 is not formed is desired from the viewpoint of the reduction in the number of the steps and the reduction in the cost.

The invention claimed is:

1. A semiconductor device comprising:
an organic insulating film having an opening,
wherein said organic insulating film has an insulated modified portion in a side of said opening, and
said modified portion includes nitrogen atoms and carbon atoms,
wherein said modified portion further comprises fluorine atoms, and
a concentration of said fluorine atoms in said modified portion is lower than a concentration of said nitrogen atoms.

2. The semiconductor device according to claim 1, further comprising:
a metal conductor whose main component is copper, formed in said opening.

3. The semiconductor device according to claim 2, wherein said metal conductor is in direct contact with said modified portion.

4. The semiconductor device according to claim 3, wherein the metal conductor comprises a barrier film whose main component is tantalum.

5. The semiconductor device according to claim 4, wherein the baffler film is in direct contact with the modified portion.

* * * * *